(12) United States Patent
Choi et al.

(10) Patent No.: US 11,422,654 B2
(45) Date of Patent: Aug. 23, 2022

(54) INPUT DETECTION UNIT AND ELECTRONIC DEVICE INCLUDING SAME

(71) Applicant: Samsung Display Co., Ltd., Yongin-Si (KR)

(72) Inventors: Daewon Choi, Cheonan-si (KR);
Yunjong Yeo, Hwaseong-si (KR);
Yu-Gwang Jeong, Anyang-si (KR);
Sungwon Cho, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/344,299

(22) Filed: Jun. 10, 2021

(65) Prior Publication Data

US 2022/0050542 A1 Feb. 17, 2022

(30) Foreign Application Priority Data

Aug. 12, 2020 (KR) .......................... 10-2020-0101021

(51) Int. Cl.
| | |
|---|---|
| *G06F 3/041* | (2006.01) |
| *H01L 51/52* | (2006.01) |
| *H01L 27/32* | (2006.01) |
| *G06F 3/044* | (2006.01) |

(52) U.S. Cl.
CPC .......... *G06F 3/0412* (2013.01); *G06F 3/0443* (2019.05); *G06F 3/0446* (2019.05); *H01L 27/323* (2013.01); *H01L 51/5253* (2013.01); *G06F 2203/04111* (2013.01); *G06F 2203/04112* (2013.01)

(58) Field of Classification Search
CPC . H01L 27/323; H01L 51/5253; G06F 3/0412; G06F 3/0446; G06F 3/0443; G06F 2203/04112; G06F 2203/04111
See application file for complete search history.

(56) References Cited

U.S. PATENT DOCUMENTS

| | | | |
|---|---|---|---|
| 10,732,746 B2 | 8/2020 | Kim et al. | |
| 2019/0123112 A1* | 4/2019 | Lee | ..................... H01L 51/5284 |
| 2020/0089351 A1 | 3/2020 | Jeong et al. | |

FOREIGN PATENT DOCUMENTS

| | | |
|---|---|---|
| KR | 10-1932650 | 12/2018 |
| KR | 10-1935383 | 1/2019 |
| KR | 10-2020-0033374 | 3/2020 |

\* cited by examiner

*Primary Examiner* — Deeprose Subedi
(74) *Attorney, Agent, or Firm* — F. Chau & Associates, LLC

(57) ABSTRACT

An electronic device includes a display panel including a plurality of pixels. A first detection insulating layer is disposed on the display panel. A first conductive pattern is disposed on the first detection insulating layer. A compensation pattern is disposed on the first detection insulating layer. A second detection insulating layer is disposed on the first detection insulating layer and covers the first detection insulating layer, the compensation pattern and the first conductive pattern. A second conductive pattern is disposed on the second detection insulating layer. The first conductive pattern includes a lower surface in contact with the first detection insulating layer. An upper surface faces the lower surface and contacts the second detection insulating layer. Lateral side surfaces extend between the lower surface and the upper surface. The compensation pattern contacts the lateral side surfaces of the first conductive pattern.

20 Claims, 14 Drawing Sheets

INPUT DETECTION UNIT AND ELECTRONIC DEVICE INCLUDING SAME

CROSS-REFERENCE TO RELATED APPLICATIONS

This U.S. application claims priority under 35 U.S.C. § 119 to Korean Patent Application No. 10-2020-0101021, filed on Aug. 12, 2020 in the Korean Intellectual Property Office, the disclosure of which is incorporated by reference in its entirety herein.

1. TECHNICAL FIELD

The present inventive concepts relate to an electronic device including an input detection unit.

2. DISCUSSION OF RELATED ART

An electronic device is activated by receiving an electrical signal. The electronic device may include an input detection unit that detects various types of inputs applied from an external source. The input detection unit may be used by itself or may further include a display unit for displaying an image to increase user convenience.

The electronic device may include various conductive patterns that are activated by an electrical signal. The area in which the conductive patterns are activated displays information or responds to a touch applied from the external source.

SUMMARY

The present inventive concepts provide an electronic device with increased visibility.

According to an embodiment of the present inventive concepts, an electronic device includes a display panel including a plurality of pixels. A first detection insulating layer is disposed on the display panel. A first conductive pattern is disposed on the first detection insulating layer. A compensation pattern is disposed on the first detection insulating layer. A second detection insulating layer is disposed on the first detection insulating layer and covers the first detection insulating layer, the compensation pattern and the first conductive pattern. A second conductive pattern is disposed on the second detection insulating layer. The first conductive pattern includes a lower surface in contact with the first detection insulating layer. An upper surface faces the lower surface and contacts the second detection insulating layer. Lateral side surfaces extend between the lower surface and the upper surface. The compensation pattern contacts the lateral side surfaces of the first conductive pattern.

In an embodiment, the upper surface of the first conductive pattern may be exposed from the compensation pattern and may be in contact with the second detection insulating layer.

In an embodiment, the compensation pattern may include an inclined surface inclined in a direction from the first detection insulating layer toward the upper surface of the first conductive pattern.

In an embodiment, the compensation pattern may be triangular on a cross section.

In an embodiment, an angle formed by the first detection insulating layer and the inclined surface may be greater than or equal to 45 degrees and less than or equal to 70 degrees.

In an embodiment, the side surface of the first conductive pattern may be inclined in a direction from the lower surface of the first conductive pattern toward the upper surface of the first conductive pattern.

In an embodiment, the first conductive pattern may include: a lower pattern disposed on the first detection insulating layer and including titanium (Ti); an upper pattern covered by the second detection insulating layer and including Ti; and an intermediate pattern disposed between the lower pattern and the upper pattern and including aluminum (Al).

In an embodiment, in one direction, a width of the lower pattern and the upper pattern may be greater than a width of the intermediate pattern in the one direction.

In an embodiment, in the one direction, a width of the lower pattern may be greater than a width of the upper pattern.

In an embodiment, the display panel may include: a circuit element layer including at least one transistor; a display element layer including a light emitting element connected to the transistor; and a sealing layer covering the display element layer, wherein the first detection insulating layer is disposed directly on the sealing layer.

In an embodiment, the compensation pattern may include a light absorbing material.

According to an embodiment of the present inventive concepts, an input detection unit includes a first detection insulating layer. A first conductive pattern is disposed on the first detection insulating layer and includes mesh lines. A compensation pattern is disposed on the first detection insulating layer. A second detection insulating layer is disposed on the first detection insulating layer and covers the first detection insulating layer, the compensation pattern and the first conductive pattern. A second conductive pattern is disposed on the second detection insulating layer and includes mesh lines. The first conductive pattern includes a lower surface in contact with the first detection insulating layer. An upper surface faces the lower surface and contacts the second detection insulating layer. Lateral side surfaces extend between the lower surface and the upper surface. The compensation pattern contacts the lateral side surfaces of the first conductive pattern.

In an embodiment, the upper surface of the first conductive pattern may be exposed from the compensation pattern and may be in contact with the second detection insulating layer.

In an embodiment, the compensation pattern may include an inclined surface inclined in a direction from the first detection insulating layer toward the upper surface of the first conductive pattern.

In an embodiment, the compensation pattern may be triangular on a cross section.

In an embodiment, an angle formed by the first detection insulating layer and the inclined surface may be greater than or equal to 45 degrees and less than or equal to 70 degrees.

In an embodiment, the side surface of the first conductive pattern may be inclined in a direction from the lower surface of the first conductive pattern toward the upper surface of the first conductive pattern.

In an embodiment, the first conductive pattern may include: a lower pattern disposed on the first detection insulating layer and including titanium (Ti); an upper pattern covered by the second detection insulating layer and including Ti; and an intermediate pattern disposed between the lower pattern and the upper pattern and including aluminum (Al).

In an embodiment, the input detection unit may include: a first detection electrode including first detection patterns arranged along a first direction and a first bridge pattern connected to the first detection patterns; and a second detection electrode including second detection patterns arranged along a second direction intersecting the first direction and a second bridge pattern disposed between the second detection patterns, wherein the first conductive pattern is composed of the first bridge pattern, wherein the second conductive pattern is composed of the first detection patterns, the second detection patterns, and the first bridge pattern.

In an embodiment, the compensation pattern may include a light absorbing material.

BRIEF DESCRIPTION OF THE DRAWINGS

The accompanying drawings are included to provide a further understanding of the present inventive concepts, and are incorporated in and constitute a part of this specification. The drawings illustrate embodiments of the present inventive concepts and, together with the description, serve to explain principles of the present inventive concepts. In the drawings.

DETAILED DESCRIPTION OF EMBODIMENTS

Figure 1A:
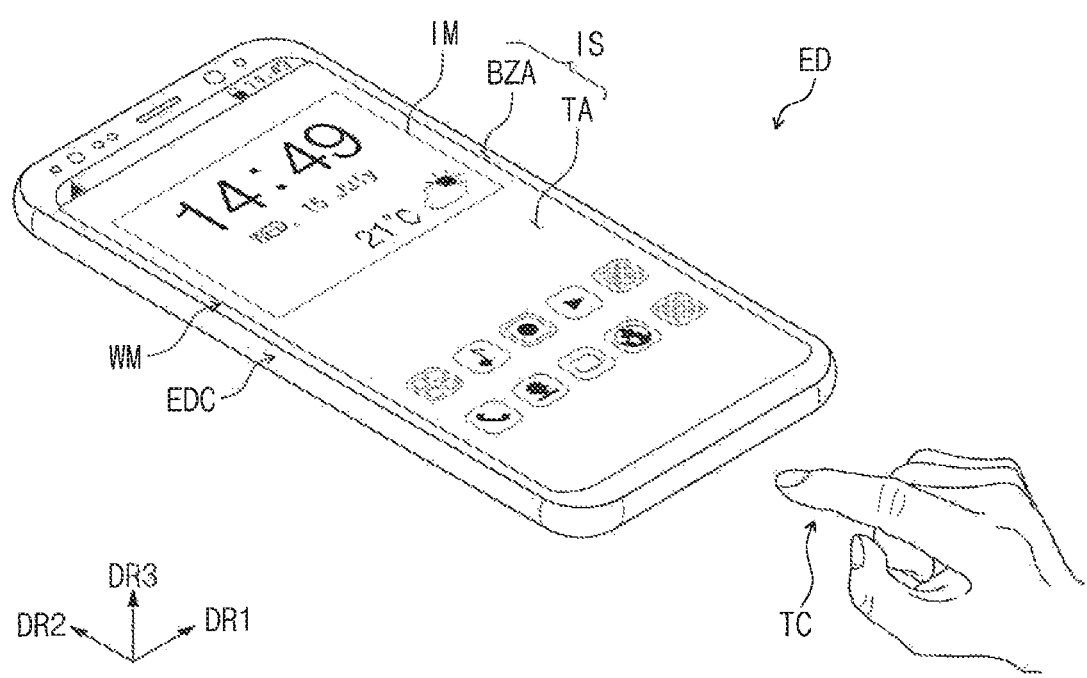
FIG. 1A is a perspective view of an electronic device according to an embodiment of the present inventive concepts.

In this specification, when it is mentioned that a component (or an area, a layer, a part, etc.) is referred to as being "on", "connected to", "contacting" or "combined to" another component, this means that the component may be directly on, connected to, contacting, or combined to the other component or a third component therebetween may be present. When a component (or an area, a layer, a part, etc.) is referred to as being "directly on", "directly connected to", "directly contacting" or "directly combined to" another component, no intervening components may be present.

Like reference numerals refer to like elements. Additionally, in the drawings, the thicknesses, proportions, and dimensions of components may be exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as commonly understood by one of ordinary skill in the art to which the present inventive concepts belong. In addition, terms defined in a commonly used dictionary should be interpreted as having a meaning consistent with the meaning in the context of the related technology, and unless interpreted in an ideal or overly formal sense, the terms are explicitly defined herein.

In various embodiments of the present inventive concepts, the term "include," "comprise," "including," or "comprising," specifies a property, a region, a fixed number, a step, a process, an element and/or a component but does not exclude other properties, regions, fixed numbers, steps, processes, elements and/or components. Hereinafter, embodiments of the present inventive concepts will be described with reference to the drawings.

Figure 1B:
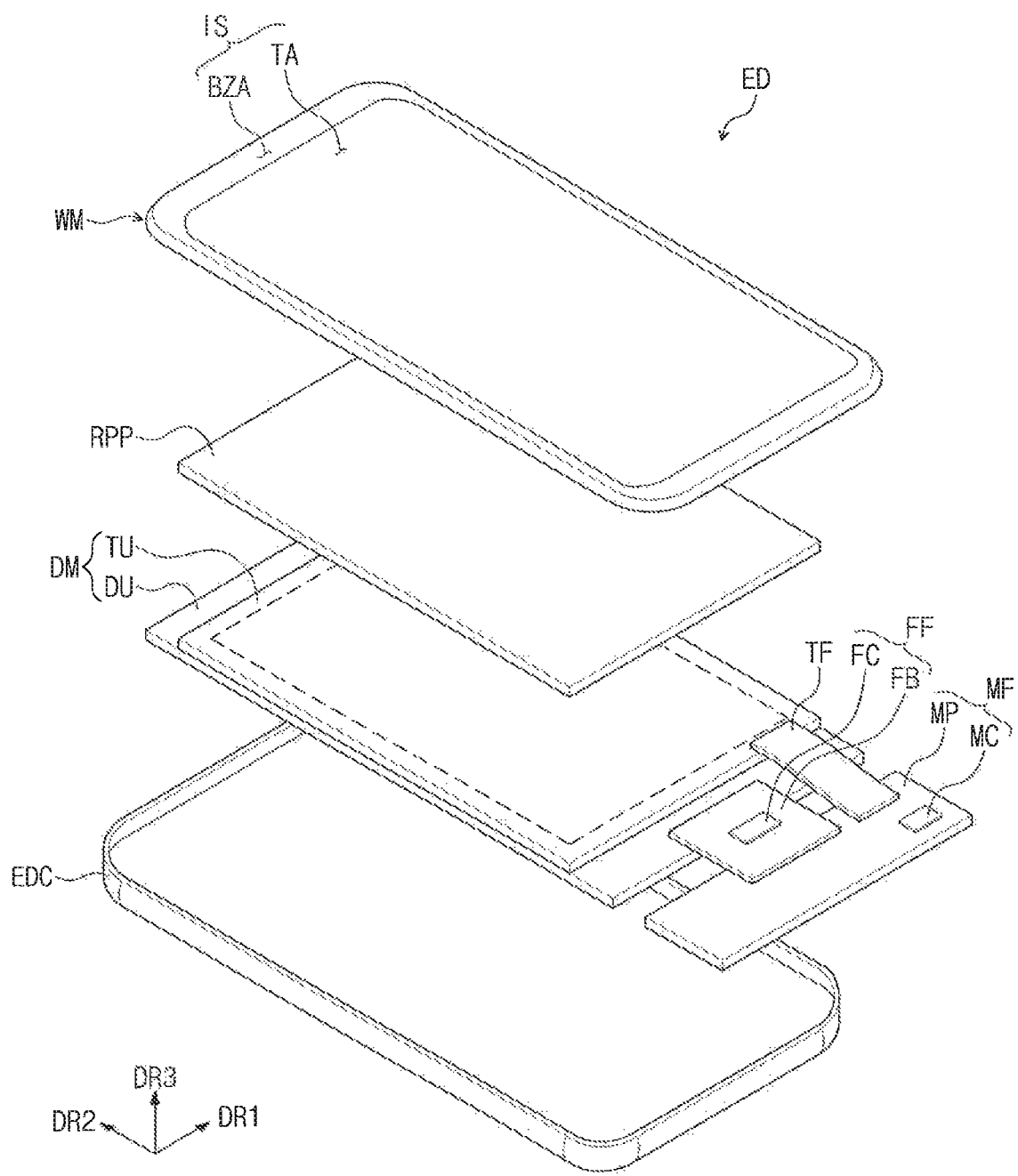
FIG. 1B is an exploded perspective view of an electronic device according to an embodiment of the present inventive concepts.
Figure 2A:
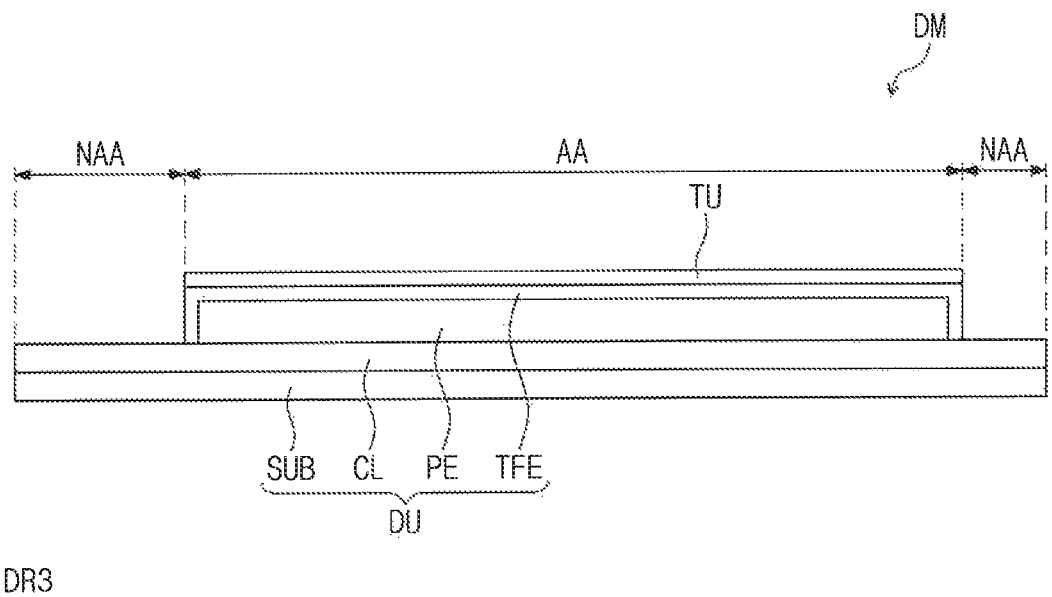
FIG. 2A is a cross-sectional view of a display module according to an embodiment of the present inventive concepts.
Figure 2B:
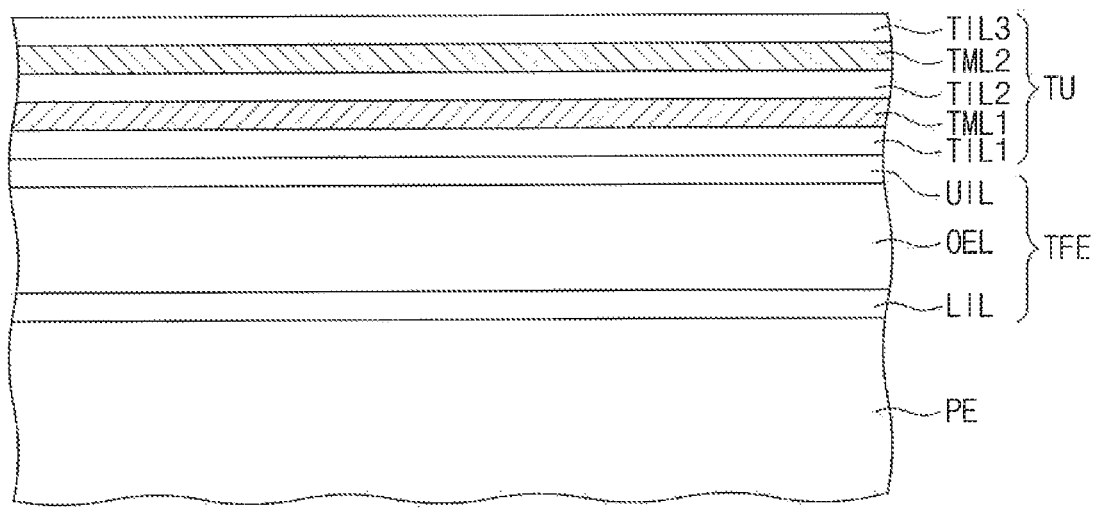
FIG. 2B is an enlarged cross-sectional view of components of FIG. 2A according to an embodiment of the present inventive concepts.
Figure 3:
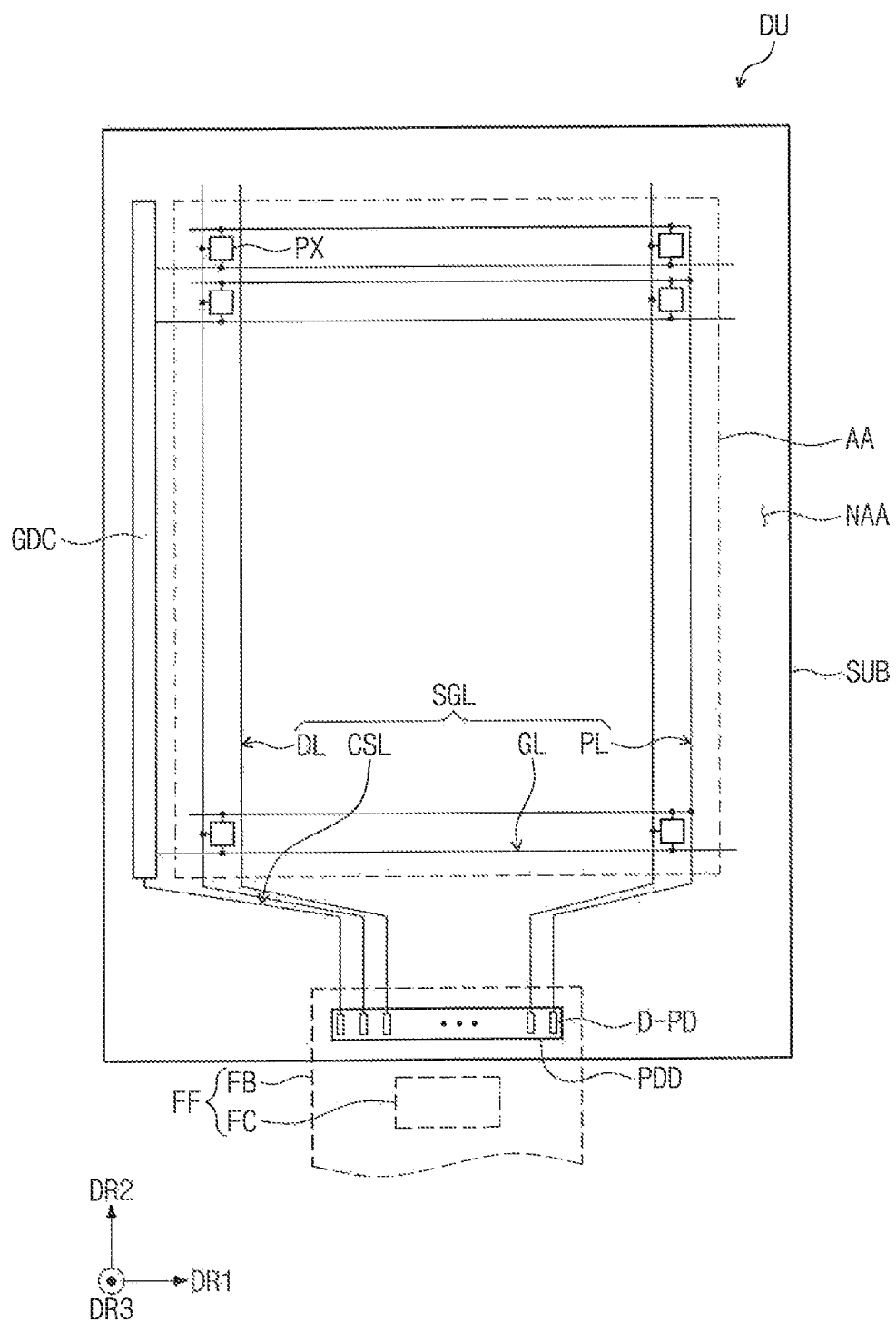
FIG. 3 is a plan view of a display unit according to an embodiment of the present inventive concepts.
Figure 4A:
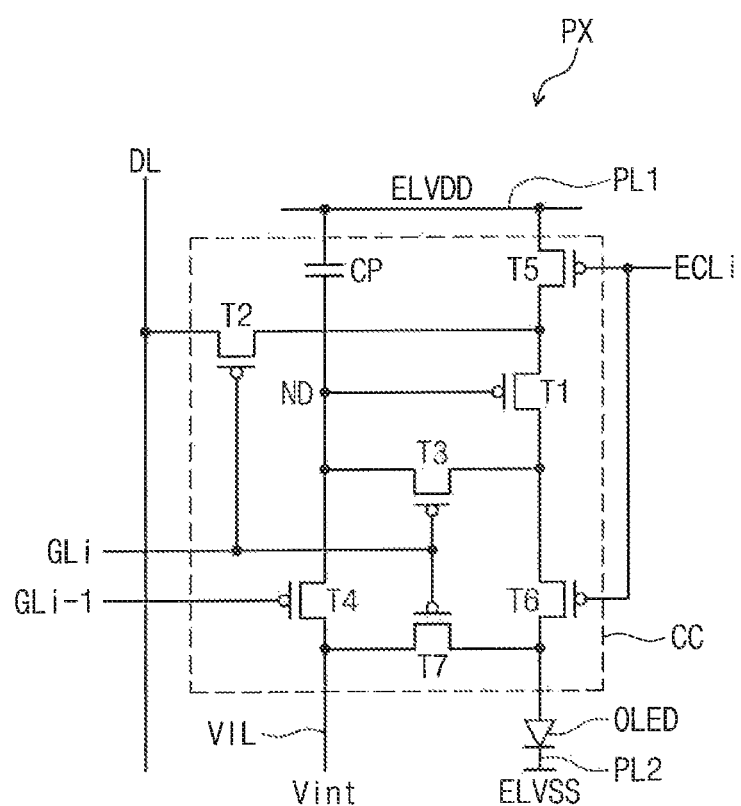
FIG. 4A is an equivalent circuit diagram of a pixel according to an embodiment of the present inventive concepts.
Figure 4B:
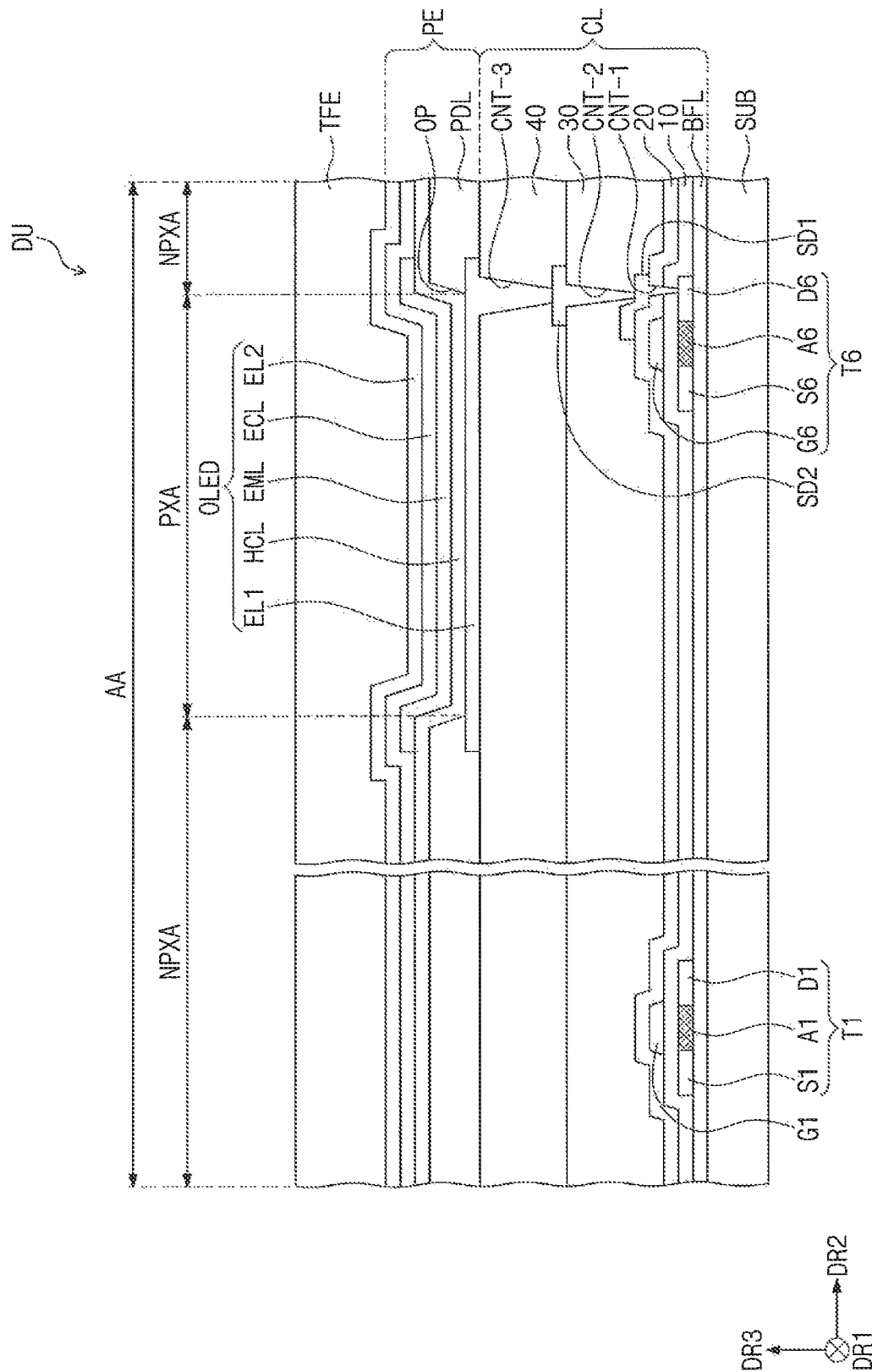
FIG. 4B is a cross-sectional view of a pixel according to an embodiment of the present inventive concepts.

FIG. 1A is a perspective view of an electronic device according to an embodiment of the present inventive concepts. FIG. 1B is an exploded perspective view of an electronic device according to an embodiment of the present inventive concepts. FIG. 2A is a cross-sectional view of a display module according to an embodiment of the present inventive concepts. FIG. 2B is an enlarged cross-sectional view of components of FIG. 2A. FIG. 3 is a plan view of a display unit according to an embodiment of the present inventive concepts. FIG. 4A is an equivalent circuit diagram of a pixel according to an embodiment of the present inventive concepts. FIG. 4B is a cross-sectional view of a pixel according to an embodiment of the present inventive concepts.

Referring to FIGS. 1A and 1B, an electronic device ED may be a device activated according to an electrical signal. The electronic device ED may include various embodiments. For example, the electronic device ED may include a tablet, a notebook computer, a computer, and a smart television. In this embodiment, the electronic device ED is exemplarily illustrated as a smart phone. However, embodiments of the present inventive concepts are not limited thereto.

The electronic device ED may provide an image IM toward the third direction DR3 on the display surface IS that extends in a plane defined in the first direction DR1 and the second direction DR2. The display surface IS on which the image IM is displayed may correspond to a front surface of the electronic device ED. However, embodiments of the present inventive concepts are not limited thereto. The image IM may include at least one still and/or dynamic image. In FIG. 1A, clock, date and weather information and software application icons are shown as an example of the image IM.

In this embodiment, the front (or upper) and the rear (or lower) of each component are defined based on the direction in which the image IM is displayed. The front and rear surfaces are opposing to each other in the third direction DR3, and a normal direction of each of the front and rear surfaces may be parallel to the third direction DR3.

The separation distance between the front and rear surfaces in the third direction DR3 may correspond to the thickness/height in the third direction DR3 of the electronic device ED. Moreover, the directions indicated by the first to third directions DR1, DR2, and DR3 are relative concepts and may be converted to other directions. Hereinafter, the first to third directions refer to the same reference numerals as directions indicated by the first to third directions DR1, DR2, and DR3, respectively.

The front surface of the electronic device ED may be divided into a transmission area TA and a bezel area BZA. The transmission area TA may be an area in which the image IM is displayed. The user visually recognizes the image IM through the transmission area TA. In the embodiment shown in FIG. 1A, the transmission area TA is illustrated in a rectangular shape with rounded corners. However, this is illustrated by way of example, and the transmission area TA may have various shapes, and is not limited to any one embodiment.

The bezel area BZA is adjacent to the transmission area TA (e.g., in the first and second directions DR1, DR2). In an embodiment, the bezel area BZA may have a predetermined color. The bezel area BZA may surround the transmission area TA. Accordingly, the shape of the transmission area TA may be substantially defined by the bezel area BZA. However, this is illustrated as an example, and the bezel area BZA may not be disposed adjacent to at least one side of the transmission area TA, or may be omitted. An electronic device according to an embodiment of the present inventive concepts may include various embodiments, and is not limited to any one embodiment.

The electronic device ED may detect an external input TC applied from the outside. The external input TC may include various types of inputs provided from the outside of the electronic device ED. For example, the external input TC may include an external input (e.g., hovering) that is applied close to or spaced a predetermined distance from the electronic device ED as well as direct contact by a portion of the body, such as the user's hand. Further, in embodiments of the present inventive concepts, the external input may have various forms such as force, pressure, and light, and is not limited to any one embodiment. In FIG. 1A, a user's hand is displayed as an example of an external input TC.

As shown in the embodiment of FIG. 1B, the electronic device ED may include a window member WM, an outer case EDC, a display module DM, an anti-reflection unit RRP, a main circuit board MF, and first and second flexible circuit boards FF and TF. The display module DM may include a display unit DU and an input detection unit TU.

The window member WM is disposed on the display module DM (e.g., in the third direction DR3). The window member WM protects the display module DM by preventing an impact applied from the outside and preventing penetration of foreign substances.

In an embodiment, the window member WM may be composed of a transparent material that light may be transmitted therethrough for emitting an image. For example, in an embodiment, the window member WM may be made of at least one material selected from glass, sapphire, plastic, and the like. In the embodiment of FIG. 1B, the window member WM is illustrated as a single layer. However, embodiments of the present inventive concepts are not limited thereto and the window member WM may include a plurality of layers. In an embodiment, the bezel area BZA of the electronic device ED described above may be substantially provided as an area in which a material including a predetermined color is printed on one area of the window member WM.

The anti-reflection unit RPP may be disposed between the window member WM and the display module DM (e.g., in the third direction DR3). The anti-reflection unit RPP reduces the reflectance of external light incident from the window member WM. An anti-reflection unit RPP according to an embodiment of the present inventive concepts may include a phase retarder and a polarizer.

In an embodiment, the retarder may be a film type or a liquid crystal coating type, and may include λ/2 retarder and/or λ/4 retarder. The polarizer may also be a film type or liquid crystal coating type. The film type may include a stretchable synthetic resin film, and the liquid crystal coating type may include liquid crystals arranged in a predetermined arrangement. The retarder and the polarizer may be implemented as one polarizing film. The anti-reflection unit RPP may further include a protective film disposed above or below the polarizing film.

The outer case EDC accommodates the display module DM. In an embodiment, the outer case EDC may be combined with the window member WM to define the appearance of the electronic device ED. The outer case EDC absorbs shocks from the outside and protects the components contained in the outer case EDC by preventing foreign matter/moisture from penetrating into the display module DM. In an embodiment, the outer case EDC may be provided in a form in which a plurality of storage members are combined.

Referring to FIGS. 2A and 2B, the display module DM according to embodiments of the present inventive concepts includes a display unit DU and an input detection unit TU disposed on the display unit DU. For example, as shown in the embodiment of FIG. 2A, the input detection unit TU may be disposed directly on the display unit DU (e.g., in the third direction DR3). The display module DM may display an image according to an electrical signal and transmit/receive information concerning an external input TC.

The display module DM may have an active area AA and an inactive area NAA defined thereon. The active area AA is an area that emits an image IM provided by the display module DM, and the inactive area NAA may be an area surrounding the active area AA (e.g., in the first and/or second directions DR1, DR2). However, this is illustrated by way of example, and the inactive area NAA may be defined in various shapes, and is not limited to any one embodiment. The active area AA of the display module DM may correspond to the transmission area TA.

As shown in the embodiment of FIG. 2A, the display unit DU includes a base substrate SUB, a circuit element layer CL, a display element layer PE, and a sealing layer TFE.

The base substrate SUB may be a flexible substrate or a rigid substrate. For example, the base substrate SUB may be a base layer on which components included in the circuit element layer CL are disposed.

The circuit element layer CL is disposed on the base substrate SUB. For example, as shown in the embodiment of FIG. 2A, the circuit element layer CL may be disposed directly on the base substrate SUB (e.g., in the third direction DR3). The circuit element layer CL may include a plurality of transistors including signal lines, a control circuit, and a semiconductor layer. In an embodiment, the display element layer PE may include an organic light emitting element OLED (see FIG. 4B) and a pixel defining layer. The sealing layer TFE seals the display element layer PE. The sealing layer TFE according to an embodiment of the present inventive concepts may include at least one organic film and at least one inorganic film.

The input detection unit TU according to an embodiment of the present inventive concepts may be disposed directly on the display unit DU. For example, in the present specification, "the configuration of a first element is disposed directly on the configuration of a second element" means that a separate adhesive member or other element is not disposed between the configuration of the first element and the configuration of the second element. In an embodiment, the second element configuration may be formed through a continuous process on the base surface provided by the first element configuration after the first element configuration is formed.

As shown in the embodiment of FIG. 2B, the sealing layer TFE according to an embodiment of the present inventive concepts may include a first sealing inorganic layer LIL, an organic layer OEL, and a second sealing inorganic layer UIL that are stacked on each other (e.g., in the third direction DR3).

The first sealing inorganic layer LIL may cover the display element layer PE. In an embodiment, the first sealing inorganic layer LIL may prevent external moisture or oxygen from penetrating into the organic light emitting element OLED. For example, in an embodiment, the first sealing inorganic layer LIL may include silicon nitride, silicon oxide, or a combination thereof. In an embodiment, the first sealing inorganic layer LIL may be formed through a chemical vapor deposition process.

The organic layer OEL may be disposed on the first sealing inorganic layer LIL (e.g., in the third direction DR3) to directly contact the first sealing inorganic layer LIL. The organic layer OEL may provide a flat surface on the first sealing inorganic layer LIL. Bends formed on the upper surface of the first sealing inorganic layer LIL or particles that are present on the first sealing inorganic layer LIL are covered by the organic layer OEL, so that the surface state of the upper surface of the first sealing inorganic layer LIL may be prevented from affecting the components formed on the organic layer OEL. In addition, the organic layer OEL may relieve stress between layers that it contacts. In an embodiment, the organic layer OEL may include an organic material, and may be formed through a solution process such as spin coating, slit coating, or inkjet process.

The second sealing inorganic layer UIL is disposed on the organic layer OEL to cover the organic layer OEL. For example, as shown in the embodiment of FIG. 2B, the second sealing inorganic layer UIL may be disposed directly on the organic layer OEL. The second sealing inorganic layer UIL may be stably formed on a relatively flat surface provided by the organic layer OEL as compared to being disposed on the first sealing inorganic layer LIL. The second sealing inorganic layer UIL seals moisture emitted from the organic layer OEL and prevents moisture from being introduced from the outside. In an embodiment, the second sealing inorganic layer UIL may include silicon nitride, silicon oxide, or a combination thereof. In an embodiment, the second sealing inorganic layer UIL may be formed through a chemical vapor deposition process.

As shown in the embodiment of FIG. 2B, the input detection unit TU is disposed on the sealing layer TFE. For example, the input detection unit TU is disposed directly on the sealing layer TFE and may be formed through a continuous process with the sealing layer TFE.

The input detection unit TU may detect an external input by any one of a self-capacitance type and a mutual capacitance type. The conductive patterns included in the input detection unit TU may be variously modified and arranged.

As shown in the embodiment of FIG. 2B, the input detection unit TU may include a detection insulating layer and at least one conductive layer (e.g., a first conductive layer TML1, a second conductive layer TML2, and conductive patterns). In an embodiment, the detection insulating layer may include a first detection insulating layer TIL1, a second detection insulating layer TIL2, and a third detection insulating layer TIL3 including any one of an inorganic material and an organic material.

According to an embodiment of the present inventive concepts, the first detection insulating layer TIL1 may be disposed directly on the second sealing inorganic layer UIL of the sealing layer TFE. The first conductive layer TML1 (or a first conductive pattern) is disposed on the first detection insulating layer TIL1. For example, as shown in the embodiment of FIG. 2B, the first conductive layer TML1 may be disposed directly on the first detection insulating layer TIL1 (e.g., in the third direction DR3). The second detection insulating layer TIL2 is disposed on the first detection insulating layer TIL1 and may cover the first conductive layer TIL1. The second conductive layer TML2 (or a second conductive pattern) is disposed on the second detection insulating layer TIL2. The third detection insulating layer TIL3 is disposed on the second detection insulating layer TIL2 and may cover the second conductive layer TML2. For example, as shown in the embodiment of FIG. 2B, the third detection insulating layer TIL3 may be disposed directly on the second detection insulating layer TIL2 (e.g., in the third direction DR3).

The first and second conductive layers TML1 and TML2 according to an embodiment of the present inventive concepts may include any one of a single-layered metal and a transparent conductive material. For example, in an embodiment, the metal may include molybdenum, silver, titanium, copper, aluminum, and alloys thereof. The transparent conductive material may include a transparent conductive oxide such as at least one compound selected from indium tin oxide (ITO), indium zinc oxide (IZO), zinc oxide (ZnO), and indium tin zinc oxide (ITZO). In addition, the transparent conductive material may include a conductive polymer such as at least one material selected from PEDOT, metal nanowires, graphene, and the like. Also, the first and second conductive layers TML1 and TML2 may include metal layers having a multilayer structure. The multi-layered metal layers may have, for example, a three-layer structure of titanium/aluminum/titanium. The multilayered first and second conductive layers TML1 and TML2 may include at least one metal layer and at least one transparent conductive layer.

Referring to the embodiment of FIG. 3, the display unit DU may include a driving circuit GDC, a plurality of signal lines SGL, and a plurality of pixels PX (hereinafter, pixels). The display unit DU may include a pixel pad part PDD disposed in the inactive area NAA and including pixel pads D-PD connected to a corresponding signal line among the plurality of signal lines SGL. For convenience of explanation, the first flexible circuit board FF connected to the pixel pad part PDD is illustrated by dotted lines.

The pixels PX are provided in plurality and disposed in the active area AA. In an embodiment, each of the pixels includes an organic light emitting element OLED and a pixel driving circuit connected thereto. The driving circuit GDC, the signal lines SGL, the pixel pad part, and the pixel driving circuit may be included in the circuit element layer CL shown in the embodiment of FIG. 2A.

The driving circuit GDC may include a gate driving circuit. The gate driving circuit generates a plurality of gate signals (hereinafter, gate signals), and sequentially outputs the gate signals to a plurality of gate lines GL (hereinafter, gate lines) to be described later. The gate driving circuit may further output another control signal to the pixel driving circuit.

In an embodiment, the gate driving circuit may include a plurality of transistors formed through the same process as the driving circuit of the pixels PX, for example, a low temperature polycrystalline silicon (LTPS) process or a low temperature polycrystalline oxide (LTPO) process.

As shown in the embodiment of FIG. 3, the signal lines SGL include gate lines GL, data lines DL, power lines PL, and control signal lines CSL. One of the gate lines GL is connected to a corresponding pixel PX of the pixels, and one of the data lines DL is connected to a corresponding pixel PX of the pixels. The power line PL is connected to the pixels. The control signal line CSL may provide control signals to the gate driving circuit.

The pixel pad part PDD is a portion to which the first flexible circuit board FF is connected, and the pixel pads D-PD of the pixel pad part PDD are connected to pads included in the first flexible circuit board FF. Accordingly, the display unit DU and the main circuit board MF may be connected to each other through the first flexible circuit board FF.

The pixel pads D-PD may be provided by exposing some of the wirings disposed on the circuit element layer CL from the insulating layer included in the circuit element layer CL.

The pixel pads D-PD are connected to the signal lines SGL and connected to corresponding pixels. In addition, a driving circuit GDC may be connected to any one of the pixel pads D-PD.

The pixel PX may be electrically connected to a plurality of signal wirings. In the embodiment of FIG. 4A, among signal wirings, gate lines GLi and GLi−1, a data line DL, a first power wiring PL1, a second power wiring PL2, an initialization power wiring VIL, and an emission control wiring ECLi are illustrated as an example. However, this is illustrated by way of example, and the pixel PX according to an embodiment of the present inventive concepts may be additionally connected to various signal wirings, and some of the illustrated signal wirings may be omitted.

As shown in the embodiment of FIG. 4A, the pixel PX may include an organic light emitting element OLED and a pixel circuit CC. The pixel circuit CC may include a plurality of transistors, such as first to seventh transistors T1 to T7, and a capacitor CP. The pixel circuit CC may control an amount of current flowing through the organic light emitting element OLED in response to a data signal.

The organic light emitting element OLED may emit light with a predetermined luminance corresponding to the amount of current provided from the pixel circuit CC. For example, the level of the first power ELVDD may be set higher than the level of the second power ELVSS.

Each of the plurality of transistors, such as the first to seventh transistors T1 to T7, may include an input electrode (e.g., a source electrode), an output electrode (e.g., a drain electrode), and a control electrode (e.g., a gate electrode). In the present specification, for convenience of explanation, one of the input electrode and the output electrode may be referred to as a first electrode, and the other may be referred to as a second electrode.

The first electrode of the first transistor T1 may be connected to the first power wiring PL1 through the fifth transistor T5. The first power wiring PL1 may be a wiring for providing the first power ELVDD. The second electrode of the first transistor T1 is connected to the anode electrode of the organic light emitting element OLED through the sixth transistor T6. In an embodiment, the first transistor T1 may be a driving transistor.

The first transistor T1 may control an amount of current flowing through the organic light emitting element OLED in response to a voltage applied to the control electrode of the first transistor TI.

The second transistor T2 is connected between the data line DL and the first electrode of the first transistor T1. In addition, the control electrode of the second transistor T2 is connected to the i-th gate line GLi. When the i-th scan signal is provided to the i-th gate line GLi, the second transistor T2 is turned on to electrically connect the data line DL and the first electrode of the first transistor T1.

The third transistor T3 is connected between the second electrode of the first transistor T1 and the control electrode of the first transistor T1. The control electrode of the third transistor T3 is connected to the i-th gate line GLi. When the i-th scan signal is provided to the i-th gate line GLi, the third transistor T3 is turned on to electrically connect the second electrode of the first transistor T1 and the control electrode of the first transistor T1. Accordingly, when the third transistor T3 is turned on, the first transistor T1 is connected in the form of a diode.

The fourth transistor T4 is connected between the node ND and the initialization power wiring VIL. In addition, the control electrode of the fourth transistor T4 is connected to the (i−1)-th gate line GLi−1. The node ND may be a node to which the fourth transistor T4 and the control electrode of the first transistor T1 are connected. When the (i−1)-th scan signal is provided to the (i−1)-th gate line GLi−1, the fourth transistor T4 is turned on to provide an initialization voltage Vint to the node ND.

The fifth transistor T5 is connected between the first power wiring PL1 and the first electrode of the first transistor T1. The sixth transistor T6 is connected between the second electrode of the first transistor T1 and the anode electrode of the organic light emitting element OLED. The control electrode of the fifth transistor T5 and the control electrode of the sixth transistor T6 are connected to the i-th emission control wiring ECLi.

The seventh transistor T7 is connected between the initialization power wiring VIL and the anode electrode of the organic light emitting element OLED. In addition, the control electrode of the seventh transistor T7 is connected to the i-th gate line GLi. When the i-th scan signal is provided to the i-th gate line GLi, the seventh transistor T7 is turned on to provide the initialization voltage Vint to the anode electrode of the organic light emitting element OLED.

The seventh transistor T7 may increase the black expression capability of the pixel PX. For example, when the seventh transistor T7 is turned on, the parasitic capacitor of the organic light emitting element OLED is discharged. Therefore, when the black luminance is subsequently implemented, the organic light emitting element OLED does not emit light due to the leakage current from the first transistor T1, and accordingly, the black expression capability may be increased.

Additionally, in the embodiment of FIG. 4A, the control electrode of the seventh transistor T7 is shown to be connected to the i-th gate line GLi. However embodiments of the present inventive concepts are not limited thereto. For example, in another embodiment of the present inventive concepts, the control electrode of the seventh transistor T7 may be connected to the (i−1)-th gate line GLi−1 or the (i+1)-th gate line (not shown).

In the embodiment of FIG. 4A, the PMOS is illustrated. However, embodiments of the present inventive concepts are not limited thereto. For example, in another embodiment of the present inventive concepts, the pixel circuit CC may be formed of an NMOS. In another embodiment of the present inventive concepts, the pixel circuit CC may be configured by a combination of NMOS and PMOS.

The capacitor CP is disposed between the first power wiring PL1 and the node ND. The capacitor CP stores a voltage corresponding to the data signal. When the fifth transistor T5 and the sixth transistor T6 are turned on, the amount of current flowing through the first transistor T1 may be determined according to the voltage stored in the capacitor CP.

The organic light emitting element OLED may be electrically connected to the sixth transistor T6 and the second power wiring PL2. The organic light emitting element OLED may receive the second power ELVSS through the second power wiring PL2. The organic light emitting element OLED may include a light emitting layer.

The organic light emitting element OLED may emit light with a voltage corresponding to a difference between the signal transmitted through the sixth transistor T6 and the second power ELVSS received through the second power wiring PL2.

In embodiments of the present inventive concepts, the structure of the pixel PX is not limited to the structure shown in FIG. 4A. In another embodiment of the present inventive concepts, the pixel PX may be implemented in various forms for allowing the organic light emitting element OLED to emit light. Additionally, while the control electrodes of the first through seventh transistors T1 to T7 are each shown as being single gate electrodes, in other embodiments one or more of the control electrodes may be dual gate electrodes, etc.

Referring to the embodiment of FIG. 4B, the display unit DU may include a plurality of insulating layers, a semiconductor pattern, a conductive pattern, and a signal line. In an embodiment, an insulating layer, a semiconductor layer, and a conductive layer may be formed by a method such as coating or vapor deposition. Thereafter, the insulating layer, the semiconductor layer, and the conductive layer may be selectively patterned by a photolithography method. In this way, semiconductor patterns, conductive patterns, signal lines, etc. included in the circuit element layer CL and the display element layer PE may be formed.

In an embodiment, the base substrate SUB may include a synthetic resin film. For example, the synthetic resin layer may include a thermosetting resin. In an embodiment, the base substrate SUB may have a multilayer structure. For example, the base substrate SUB may have a three-layer structure of a synthetic resin layer, an adhesive layer, and a synthetic resin layer. In an embodiment, the synthetic resin layer may be a polyimide resin layer and the material thereof is not particularly limited. In an embodiment, the synthetic resin layer may include at least one material selected from acrylic resin, methacrylic resin, polyisoprene, vinyl resin, epoxy resin, urethane resin, cellulose resin, siloxane resin, polyamide resin, and perylene resin. In addition, the base substrate SUB may include a glass substrate, a metal substrate, or an organic/inorganic composite material substrate.

At least one inorganic layer may be disposed on the upper surface of the base substrate SUB. In an embodiment, the inorganic layer may include at least one compound selected from aluminum oxide, titanium oxide, silicon oxide silicon oxynitride, zirconium oxide, and hafnium oxide. The inorganic layer may be formed in multiple layers. The multilayered inorganic layers may constitute a barrier layer and/or a buffer layer.

In the embodiment shown in FIG. 4B, the display unit DU is shown to include the buffer layer BFL. The buffer layer BFL increases the bonding force between the base substrate SUB and the semiconductor pattern included in the transistor. In an embodiment, the base substrate SUB may include a silicon oxide layer and a silicon nitride layer. For example, the silicon oxide layer and the silicon nitride layer may be alternately stacked (e.g., in the third direction DR3).

A semiconductor pattern is disposed on the buffer layer BFL. In an embodiment, the semiconductor pattern may include polysilicon. However, embodiments of the present inventive concepts are not limited thereto, and the semiconductor pattern may include amorphous silicon or metal oxide, etc.

FIG. 4B illustrates only some of the semiconductor patterns, and a semiconductor pattern may be further disposed in another area of the pixel PX on a plane. For example, the semiconductor pattern may have a specific arrangement corresponding to the pixels. Semiconductor patterns have different electrical properties depending on whether they are doped or not. The semiconductor pattern may include a doped area and a non-doped area. The doped area may be doped with an N-type dopant or a P-type dopant. P-type transistors include a doped area doped with a P-type dopant.

The doped area is more conductive than the non-doped area, and substantially serves as an electrode or signal line. The non-doped area actually corresponds to the active (or channel) of the transistor. For example, a partial portion of the semiconductor pattern may be an active part of the transistor, another partial portion may be a source or drain of the transistor, and another partial portion may be a connection electrode or a connection signal line.

As shown in the embodiment of FIG. 4B, the source S1, the active A1, and the drain D1 of the first transistor T1 are formed from a semiconductor pattern, and the source S6, the active A6, and the drain D6 of the sixth transistor T6 are formed from a semiconductor pattern. The sources S1 and S6 and the drains D1 and D6 extend in opposite directions (e.g., in the second direction DR2) from the actives A1 and A6 on a cross section. FIG. 4B may illustrates a part of a connection signal line formed from a semiconductor pattern.

The first intermediate insulating layer 10 is disposed on the buffer layer BFL. For example, the first intermediate insulating layer 10 may be disposed directly on the buffer layer BFL (e.g., in the third direction DR3). The first intermediate insulating layer 10 commonly overlaps a plurality of pixels and covers a semiconductor pattern. In an embodiment, the first intermediate insulating layer 10 may be an inorganic layer and/or an organic layer, and may have a single layer or multilayer structure. The first intermediate insulating layer 10 may include at least one compound selected from aluminum oxide, titanium oxide, silicon oxide, silicon oxynitride, zirconium oxide, and hafnium oxide. In this embodiment, the first intermediate insulating layer 10 may be a single-layer silicon oxide layer. The first intermediate insulating layer 10 as well as the insulating layer of the circuit element layer CL to be described later may be an inorganic layer and/or an organic layer, and may have a single layer or multilayer structure. The inorganic layer may include at least one of the above-mentioned materials.

Gates G1 and G6 are disposed on the first intermediate insulating layer 10. The gate G1 may be a part of the metal pattern. The gates G1 and G6 may overlap the actives A1 and A6. In the process of doping the semiconductor pattern, the gates G1 and G6 are the same as the mask.

A second intermediate insulating layer 20 covering the gates G1 and G6 is disposed on the first intermediate insulating layer 10. For example, the second intermediate insulating layer 20 may be disposed directly on the first intermediate insulating layer 10 (e.g., in the third direction DR3). The second intermediate insulating layer 20 may overlap the pixels in common. The second intermediate insulating layer 20 may be an inorganic layer and/or an organic layer, and may have a single layer or multilayer structure. In this embodiment, the second intermediate insulating layer 20 may be a single-layer silicon oxide layer.

The first connection electrode SD1 may be disposed on the second intermediate insulating layer 20. The first connection electrode SD1 may be connected to the connection signal line through a contact hole CNT-1 penetrating the first intermediate insulating layer 10 and the second intermediate insulating layer 20.

The first insulating layer 30 is disposed on the second intermediate insulating layer 20. For example, the first insulating layer 30 may be disposed directly on the second intermediate insulating layer 20 (e.g., in the third direction DR3). The first insulating layer 30 may be an organic layer. A second connection electrode SD2 may be disposed on the first insulating layer 30. The second connection electrode SD2 may be connected to the first connection electrode SD1 through a contact hole CNT-2 penetrating the first insulating layer 30.

A second insulating layer 40 covering the second connection electrode SD2 is disposed on the first insulating layer 30. For example, the second insulating layer 40 may be disposed directly on the first insulating layer 30 (e.g., in the third direction DR3). The second insulating layer 40 may be an organic layer. The first electrode EL1 is disposed on the second insulating layer 40. The first electrode EL1 is connected to the second connection electrode SD2 through a contact hole CNT-3 penetrating the second insulating layer 40. A display opening part OP is defined in the pixel defining film PDL. The display opening part OP of the pixel defining film PDL exposes at least a partial portion of the first electrode EL1. For example, as shown in the embodiment of FIG. 4B, the pixel defining film PDL may cover lateral ends of the first electrode EL1 and the display opening part OP may expose a central portion of the first electrode EL1 (e.g., in the second direction DR2).

As illustrated in the embodiment of FIG. 4B, the active area AA (refer to FIG. 2A) of the display unit DU may include an emission area PXA and a non-emission area NPXA adjacent to the emission area PXA. The non-emission area NPXA may surround the emission area PXA. As shown in the embodiment of FIG. 4B, the emission area PXA is defined to correspond to the area of the first electrode EL1 exposed by the display opening part OP.

The hole control layer HCL may be commonly disposed in the emission area PXA and the non-emission area NPXA. The hole control layer HCL may include a hole transport layer, and may further include a hole injection layer. A light emitting layer EML is disposed on the hole control layer HCL. The light emitting layer EML may be disposed in an area corresponding to the display opening part OP. For example, in an embodiment, the light emitting layer EML may be formed separately on each of the pixels.

The electronic control layer ECL is disposed on the light emitting layer EML. The electron control layer ECL may include an electron transport layer and may further include an electron injection layer. In an embodiment, the hole control layer HCL and the electron control layer ECL may be commonly formed in the plurality of pixels using an open mask. The second electrode EL2 is disposed on the electronic control layer ECL. The second electrode EL2 has an integral shape and is commonly disposed in a plurality of pixels.

A sealing layer TFE is disposed on the second electrode EL2. For example, as shown in the embodiment of FIG. 4B, the sealing layer TFE may be disposed directly on the second electrode EL2 (e.g., in the third direction DR3) and the sealing layer TFE may directly cover the second electrode EL2. However, embodiments of the present inventive concepts are not limited thereto. For example, in an embodiment of the present inventive concepts, a capping layer covering the second electrode EL2 may be further disposed between the sealing layer TFE and the second electrode EL2. In this embodiment, the sealing layer TFE may directly cover the capping layer. As shown in the embodiment of FIG. 4B, the sealing layer TFE may be commonly disposed on a plurality of pixels.

The sealing layer TFE is disposed on the organic light emitting element OLED to seal the organic light emitting element OLED. While the embodiment of FIG. 4B shows the sealing layer disposed directly on the organic light emitting element OLED, embodiments of the present inventive concepts are not limited thereto. For example, a capping layer covering the second electrode EL2 may be further disposed between the second electrode EL2 and the organic light emitting element OLED. The sealing layer TFE shown in the embodiment of FIG. 4B may correspond to the sealing layer TFE described with reference to the embodiment of FIG. 2B.

Referring again to the embodiment of FIG. 1B, the main circuit board MF includes a base circuit board MP and a driving element MC. The base circuit board MP is connected to the first flexible circuit board FF to be electrically connected to the display unit DU, and the base circuit board MP is connected to the second flexible circuit board TF and is electrically connected to the input detection unit TU. In an embodiment, the base circuit board MP may be formed of a flexible printed circuit board (FPCB).

The driving element MC may include a timing controller. The timing controller receives the input image signals and converts the input image signals into image data corresponding to the operation of the pixels. In addition, the timing controller may receive various control signals, for example, a vertical synchronization signal, a horizontal synchronization signal, a main clock signal, and a data enable signal, and output signals corresponding to the respective signals. Further, the driving element MC may include a control unit that controls the input detection unit TU, and is not limited to any one embodiment.

The first flexible circuit board FF is connected to one side of the display unit DU to electrically connect the display unit DU and the main circuit board MF. The first flexible circuit board FF includes a base film FB and a driving chip FC.

The base film FB is flexible and may include a plurality of circuit wirings. Accordingly, the base film FB may be provided in various forms corresponding to the purpose and shape of the display unit DU.

In an embodiment, the driving chip FC may be mounted on the base film FB in the form of a Chip On Film (COF). The driving chip FC may include driving elements for driving pixels, such as a data driving circuit. The first flexible circuit board FF is shown in the embodiment of FIG. 1B as being one circuit board. However, embodiments of the present inventive concepts are not limited thereto. For example, the first flexible circuit board FF may be provided in plurality to be connected to the display unit DU.

The second flexible circuit board TF is connected to one side of the input detection unit TU to electrically connect the input detection unit TU and the main circuit board MF. The second flexible circuit board TF is flexible and may include a plurality of circuit wirings. The second flexible circuit board TF transmits input detection signals provided from the main circuit board MF to the input detection unit TU.

Figure 5A:
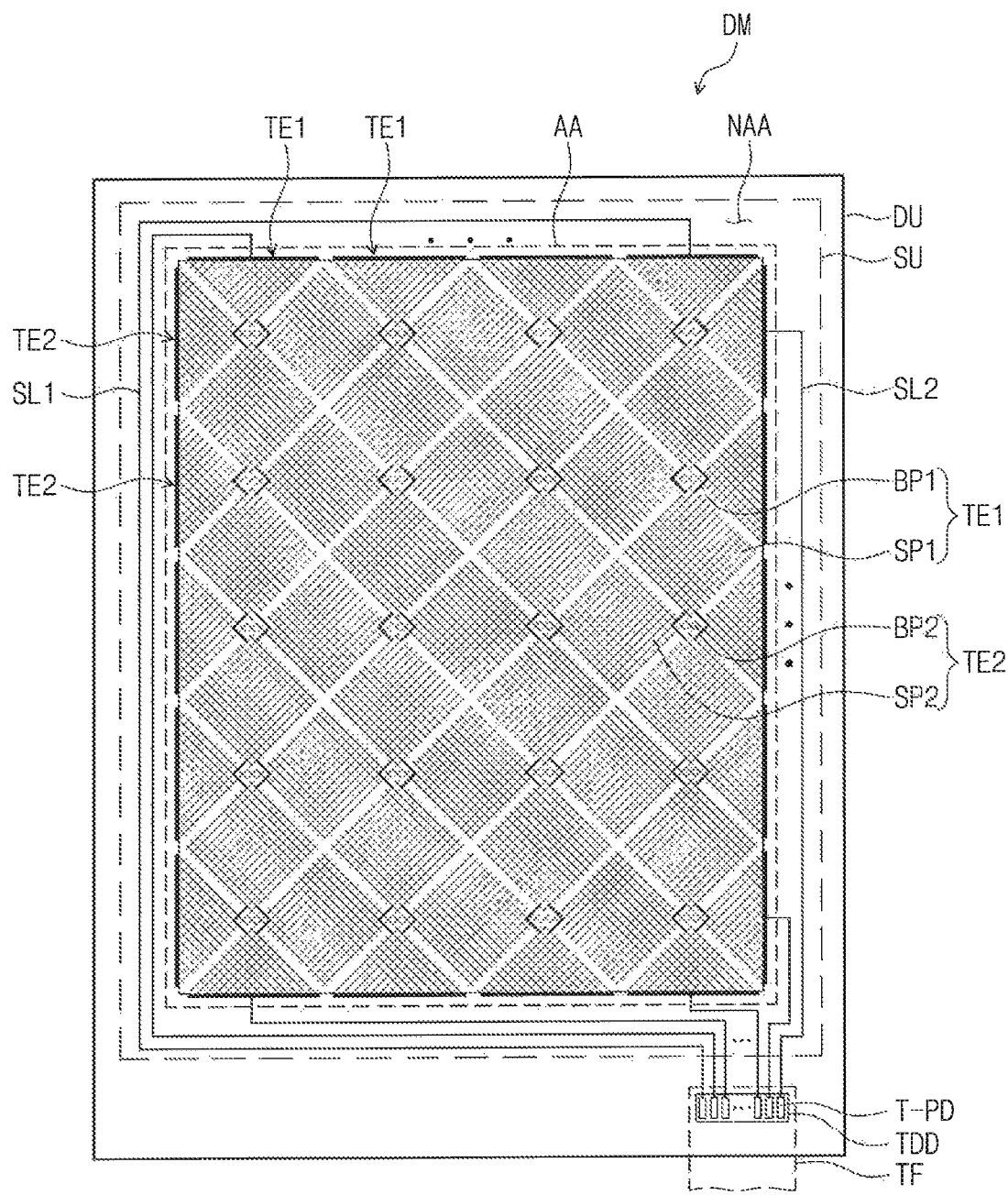
FIG. 5A is a plan view of an input detection unit according to an embodiment of the present inventive concepts.
Figure 5B:
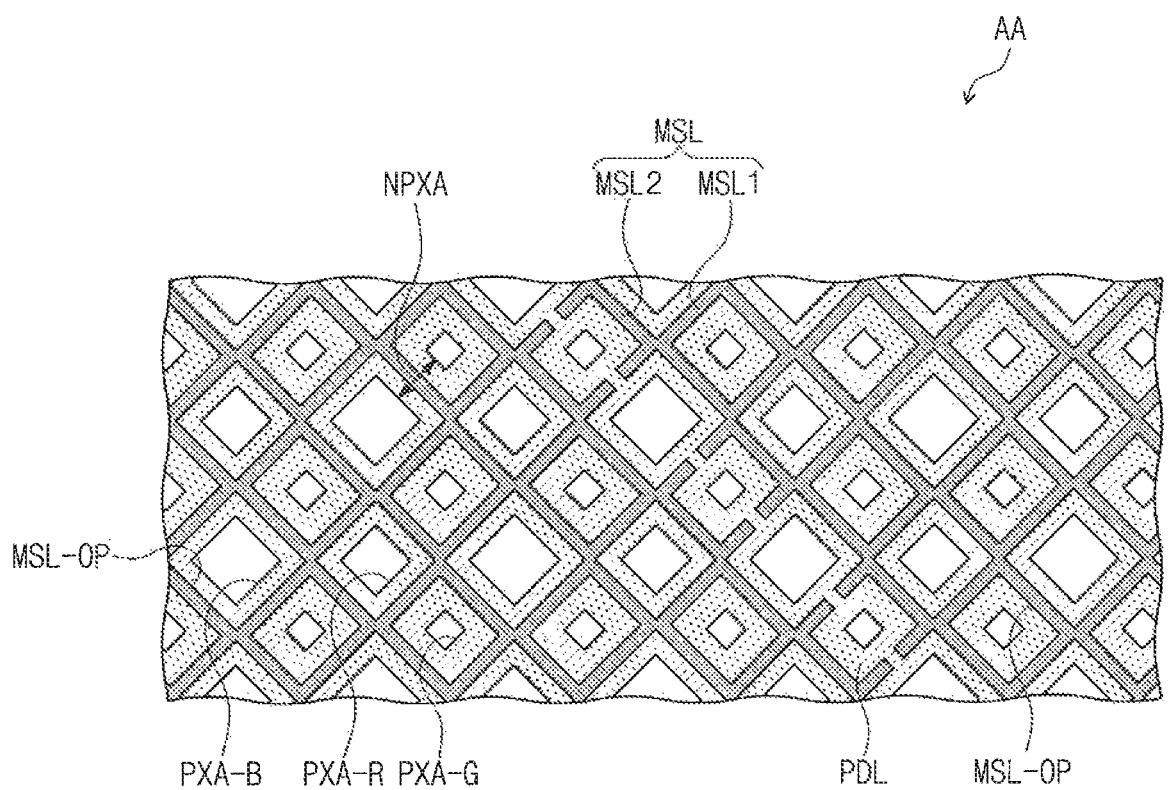
FIG. 5B is an enlarged view of an area of an input detection unit according to an embodiment of the present inventive concepts.
Figure 5B:
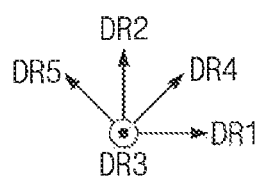
Figure 6:
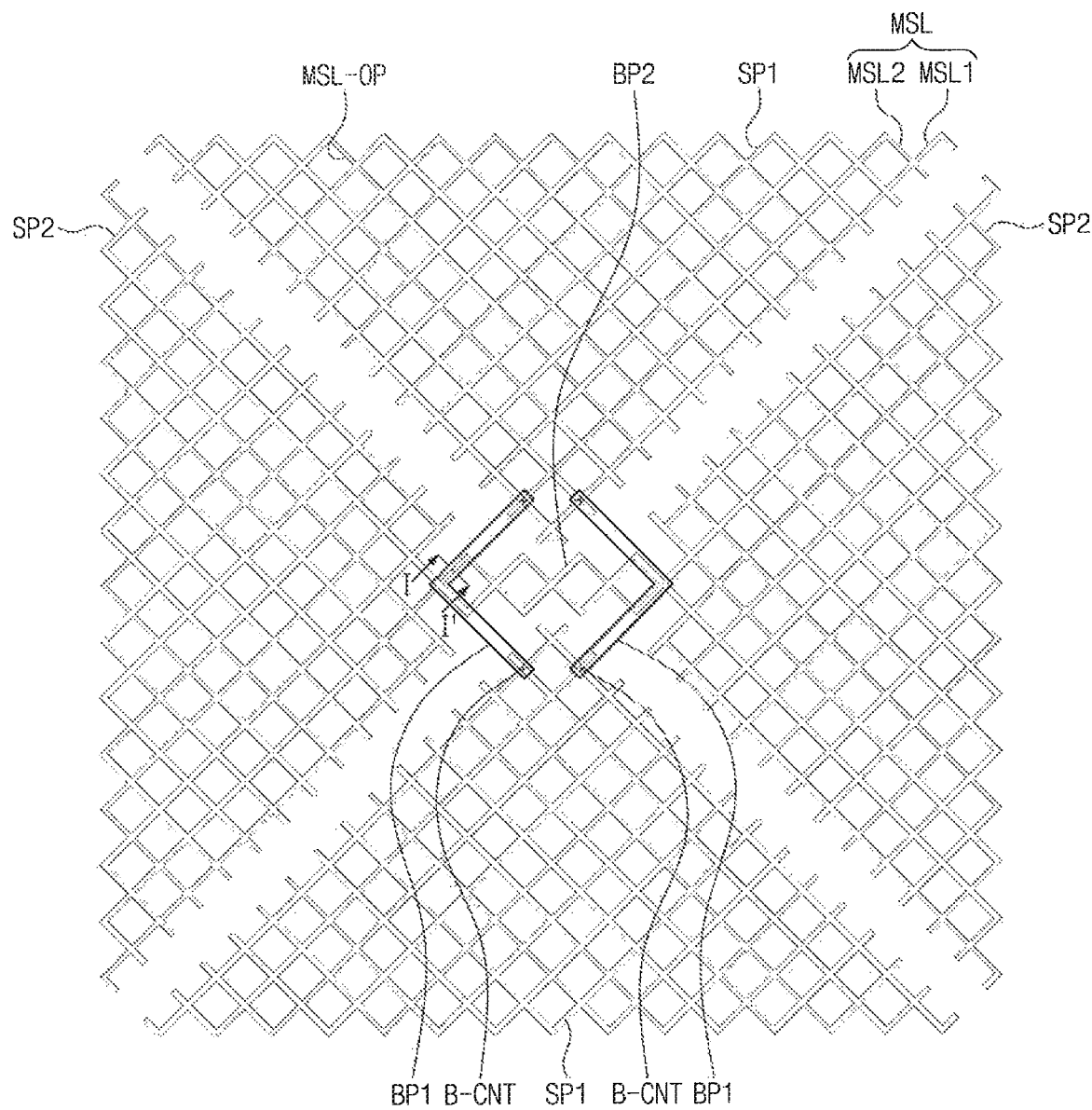
FIG. 6 is an enlarged view of an area of an input detection unit according to an embodiment of the present inventive concepts.
Figure 7:
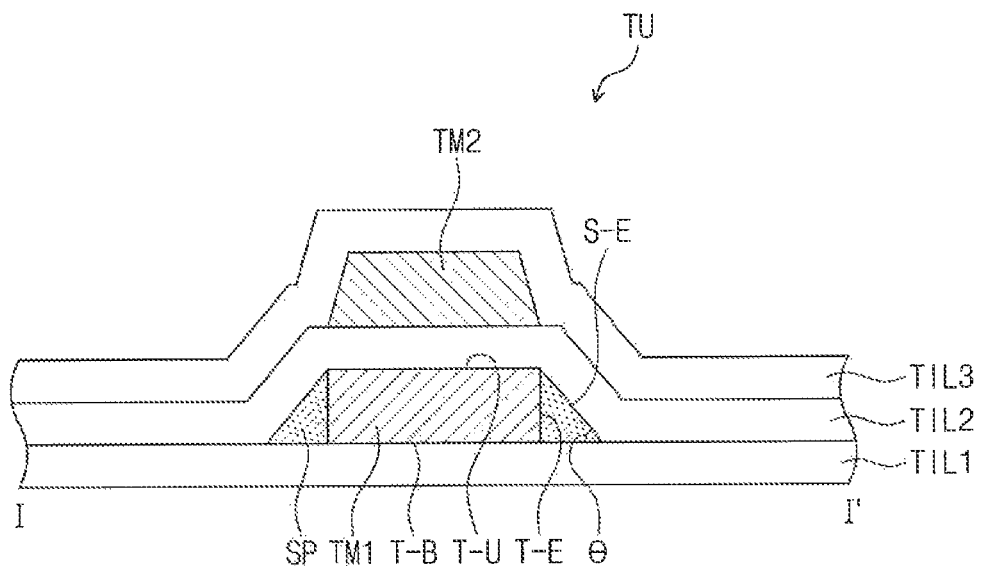
FIG. 7 is a cross-sectional view taken along line I-I' shown in FIG. 6 according to an embodiment of the present inventive concepts.

FIG. 5A is a plan view of an input detection unit according to an embodiment of the present inventive concepts. FIG. 5B is an enlarged view of an area of an input detection unit according to an embodiment of the present inventive concepts. FIG. 6 is an enlarged view of an area of an input detection unit according to an embodiment of the present inventive concepts. FIG. 7 is a cross-sectional view taken along line I-I' shown in FIG. 6 according to an embodiment of the present inventive concepts.

As shown in the embodiment of FIG. 5A, the input detection unit TU may include a detection pad part TDD, a first detection electrode TE1, a second detection electrode TE2, a first signal line SL1, a second signal line SL2, and detection pads T-PD.

In an embodiment, the first and second conductive layers TML1 and TML2 (e.g., first and second conductive patterns) described in the embodiment of FIG. 2B may constitute the first detection electrode TE1, the second detection electrode TE2, the first signal line SL1, the second signal line SL2, and the detection pads T-PD.

As shown in the embodiment of FIG. 5A, the first detection electrode TE1 extends along the second direction DR2. A plurality of first detection electrodes TE1 may be provided and may be arranged along the first direction DR1. The first detection electrode TE1 includes a plurality of first detection patterns SP1 arranged along the second direction DR2 and first bridge patterns BP1 disposed between the first detection patterns SP1 (e.g., in the second direction DR2) to connect the adjacent first detection patterns SP1.

The second detection electrode TE2 may be disposed to be insulated from the first detection electrode TE1. The second detection electrode TE2 extends along the first direction DR1. A plurality of second detection electrodes TE2 may be provided and may be arranged along the second direction DR2. The second detection electrode TE2 includes a plurality of second detection patterns SP2 arranged along the first direction DR1 and second bridge patterns BP2 disposed between the second detection patterns SP2 (e.g., in the first direction DR1) to connect adjacent second detection patterns SP2.

In an embodiment, the input detection unit TU may detect a change in mutual capacitance between the first detection electrode TE1 and the second detection electrode TE2 to detect the external input TC (see FIG. 1A), or may detect a change in self capacitance of each of the first detection electrode TE1 and the second detection electrode TE2 to detect the external input TC. However, embodiments of the present inventive concepts are not limited thereto and the input detection unit TU may detect the external input TC in various different ways.

As shown in the embodiment of FIG. 5A, the first signal line SL1 is connected to the first detection electrode TE1. The first signal line SL1 may be disposed in the peripheral area NAA and may not be visually recognized from the outside. The second signal line SL2 is connected to the second detection electrode TE2. The second signal line SL2 may be disposed in the peripheral area NAA and may not be visually recognized from the outside.

As shown in the embodiment of FIG. 5A, one first detection electrode TE1 may be connected to two first signal lines SL1. For example, a first end and the opposite second end of one first detection electrode TE1 may be connected to different first signal lines SL1 and may be connected to two first pads. As shown in the embodiment of FIG. 5A, one second signal line SL2 may be connected to the second detection electrode TE2. Accordingly, even if the first detection electrode TE1 has a relatively large length compared to the second detection electrode TE2, the electrical signal may be uniformly applied to the entire area. Accordingly, the input detection unit TU may provide a uniform external input detection environment for the entire active area AA, regardless of the shape.

However, embodiments of the present inventive concepts are not limited thereto. For example, in an embodiment, the second detection electrode TE2 may also have a first end and an opposite second end connected to two separate second signal lines SL2 or each of the first detection electrode TE1 and the second detection electrode TE2 may be connected to only one first signal line. The input detection unit TU according to an embodiment of the present inventive concepts may be driven in various ways, and is not limited to any one embodiment.

The detection pad part TDD is an element to which the second flexible circuit board TF is connected, and the detection pads T-PD of the detection pad part TDD are connected to pads included in the second flexible circuit board TF. Accordingly, the input detection unit TU and the main circuit board MF (FIG. 1B) may be connected through the second flexible circuit board TF.

FIG. 5B illustrates the relationship between the first and second detection electrodes TE1 and TE2 included in the input detection unit TU within the active area AA and the first to third emission areas PXA-R, PXA-G, and PXA-B included in the display unit DU. One emission area PXA described with reference to the embodiment of FIG. 4B may correspond to any one of the first to third emission areas PXA-R, PXA-G, and PXA-B illustrated in the embodiment of FIG. 5B. However, embodiments of the present inventive concepts are not limited thereto and the display unit DU may include various numbers of emission areas.

The input detection unit TU according to the present inventive concepts may include a plurality of first and second mesh lines MSL1 and MSL2 extending in the fourth direction DR4 and the fifth direction DR5, respectively. As shown in the embodiment of FIG. 5B, the fourth direction DR4 may be between the first direction DR1 and the second direction DR2 and the fifth direction DR5 may be between second direction DR2 and a direction opposite to the first direction DR1. The first and second mesh lines MSL1 and MSL2 do not overlap the first to third emission areas PXA-R, PXA-G, and PXA-B, and overlap the non-emission area NPXA. Accordingly, the display opening parts OP defined in the pixel defining film PDL may overlap the corresponding mesh opening parts MSL-OP.

As shown in the embodiment of FIG. 5B, the first and second mesh lines MSL1 and MSL2 define a plurality of mesh opening parts MSL-OP. In an embodiment, the line width of the mesh lines may be about several micrometers to about several nanometers. The plurality of opening parts MSL-OP may correspond one-to-one to the first to third emission areas PXA-R, PXA-G, and PXA-B. FIG. 5B shows first to third emission areas PXA-R, PXA-G, and PXA-B divided into three groups according to emission color.

The first to third emission areas PXA-R, PXA-G, and PXA-B may have different areas (e.g., area in a plane defined in the fourth and fifth directions DR4, DR5) depending on the color emitted from the light emitting layer EML of the organic light emitting element OLED. The areas of the first to third emission areas PXA-R, PXA-G, and PXA-B may be determined according to the type of the organic light emitting element OLED.

The plurality of mesh opening parts MSL-OP may be divided into several groups having different areas. The plurality of mesh opening parts MSL-OP may be divided into three groups according to corresponding first to third emission areas PXA-R, PXA-G, and PXA-B.

While the embodiment of FIG. 5B shows the mesh opening parts MSL-OP corresponding one-to-one to the first to third emission areas PXA-R, PXA-G, and PXA-B, embodiments of the present inventive concepts are not limited thereto. For example, in an embodiment, one mesh opening part MSL-OP may correspond to two or more of the first to third emission areas PXA-R, PXA-G, and PXA-B, etc.

The first to third emission areas PXA-R, PXA-G, and PXA-B are illustrated as having differently sized areas from each other. However, embodiments of the present inventive concepts are not limited thereto and the first to third emission areas PXA-R, PXA-G, and PXA-B may have the same size, and the mesh opening parts MSL-OP may have the same size in some embodiments.

According to an embodiment of the present inventive concepts, as the first and second mesh lines MSL1 and MSL2 constituting the first and second detection electrodes TE1 and TE2 are disposed to not overlap the first to third emission areas PXA-R, PXA-G, and PXA-B, the first and second detection electrodes TE1 and TE2 may not interfere with the light emitted from the pixel PX. Accordingly, the electronic device ED may have an increased color purity.

FIG. 6 illustrates an enlarged view of a portion of each of the first detection patterns SP1, the first bridge pattern BP1, the second detection patterns SP2, and the second bridge pattern BP2 constituting one pattern in the first and second detection electrodes TE1 and TE2.

The second detection insulating layer TIL2 according to an embodiment of the present inventive concepts includes a plurality of contact holes B-CNT. The contact holes B-CNT may overlap a portion of the first detection patterns SP1 and the first bridge pattern BP1 (e.g., in the third direction DR3).

The first bridge pattern BP1 is disposed on the first detection insulating layer TIL1. A portion of the first detection patterns SP1 may be connected to the first bridge pattern BP1 through the contact holes B-CNT defined in the second detection insulating layer TIL2. The contact holes B-CNT may overlap the mesh lines MSL (e.g., in the third direction DR3).

Referring to FIG. 7, an input detection unit TU according to an embodiment of the present inventive concepts may include a compensation pattern SP. The compensation pattern SP may be disposed on the first detection insulating layer TIL1 of the input detection unit TU. For example, as shown in the embodiment of FIG. 7, a lower surface of the compensation pattern SP may directly contact an upper surface of the first detection insulating layer TIL1. The compensation pattern SP may surround the first conductive pattern TM1.

Figure 8:
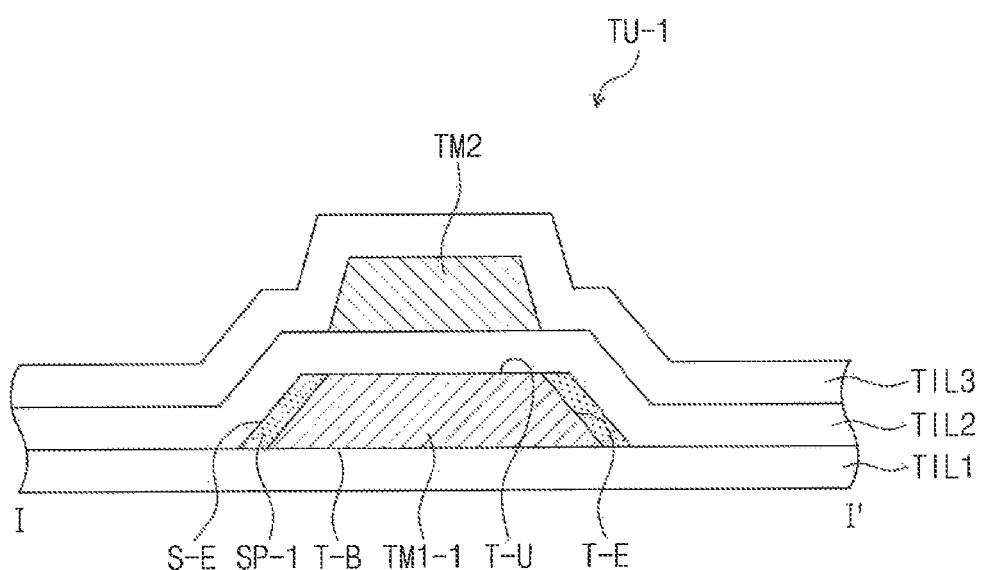
FIG. 8 is a cross-sectional view of an input detection unit taken along line I-I' shown in FIG. 6 according to an embodiment of the present inventive concepts.

As shown in the embodiment of FIG. 8, the second detection insulating layer TIL2 may cover the first detection insulating layer TIL1, and the second conductive pattern TM2 may be disposed on the second detection insulating layer TIL2. For example, a lower surface of the second detection insulating layer TIL2 may directly contact and cover upper surfaces of the first detection insulating layer TIL1, the compensation pattern SP and the first conductive pattern TM1. The third detection insulating layer TIL3 may cover the second detection insulating layer TIL2 and the second conductive pattern TM2.

The first conductive pattern TM1 may include a lower surface T-B, an upper surface T-U, and lateral side surfaces T-E. As shown in the embodiment of FIG. 7 the lower surface T-B is disposed directly on the first detection insulating layer TIL1. The upper surface T-U directly contacts and is covered by the second detection insulating layer TIL2 and may face (e.g., be disposed opposite to) the lower surface T-B. The lateral side surfaces T-E extend between the lower surface T-B and the upper surface T-U, so that the lateral side surfaces T-E may connect the lower surface T-B to the upper surface T-U.

As shown in the embodiment of FIG. 7, the compensation pattern SP may cover the lateral side surfaces T-B of the first conductive pattern TM1. The upper surface T-U of the first conductive pattern TM1 may be exposed by the compensation pattern SP and may be covered by the second detection insulating layer TIL2.

In the embodiment of FIG. 7, the shape of the compensation pattern SP in the cross-section may be a triangle. For example, the compensation pattern SP may include an inclined surface S-E inclined in a direction from a lower surface of the first detection insulating layer SP to the upper surface T-U of the first conductive pattern TM1. In an embodiment, an angle θ formed by the inclined surface S-E with the first detection insulating layer TIL1 may be about 45 degrees to about 70 degrees.

According to an embodiment of the present inventive concepts, the sum of the width (e.g., the combined widths) of the compensation pattern SP and the width of the first conductive pattern TM1 in one direction (e.g., a horizontal direction parallel to an upper surface of the first detection insulating layer TIL1, such as the fifth direction DR5) may be greater than the width of the entire second conductive pattern TM2 in the one direction.

In addition, in an embodiment of the present inventive concepts, the compensation pattern SP may include various light blocking materials and may not include a conductive material.

According to an embodiment of the present inventive concepts, the first conductive pattern TM1 (or a first conductive layer) may be configured of the first bridge patterns BP1 and the compensation pattern SP, and the second conductive pattern TM2 (or a second conductive layer) may be configured of the first detection patterns SP1, the second detection patterns SP2, and the second bridge patterns BP2. However, embodiments of the present inventive concepts are not limited thereto.

According to an embodiment of the present inventive concepts, since the compensation pattern SP surrounds the lateral side surfaces T-E of the first conductive pattern SP1. Therefore, even if the thicknesses of the first and second detection patterns SP1 and SP2 are increased to reduce resistance and increase the sensing function, a problem in which the lateral side surfaces T-E of the first conductive pattern TM1 is reflected by external light and is visually recognized by the user may be prevented.

In addition, in a process for forming a second conductive pattern TM2 by applying a conductive material on the first detection insulating layer TIL1 and then patterning the conductive material, as the conductive material is applied on the inclined surface S-E, the conductive material may be prevented from being thickly accumulated around the lateral side surfaces T-E of the first conductive pattern TM1 due to a step difference of the first conductive pattern TM1. Accordingly, a second conductive pattern TM2 without particles may be formed on the second detection insulating layer TIL2. Accordingly, an input detection unit TU with increased reliability and visibility may be provided.

Figure 9:
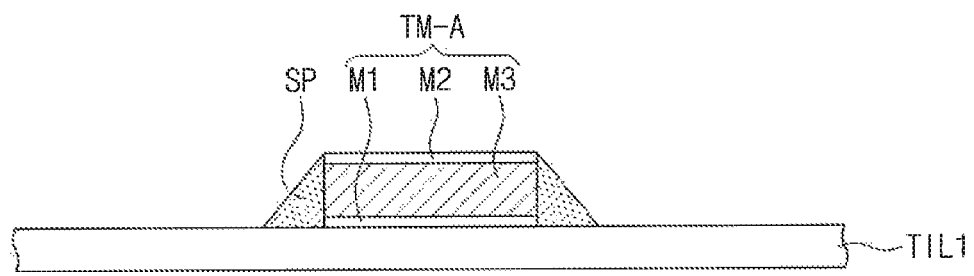
FIG. 9 is a cross-sectional view of an input detection unit according to an embodiment of the present inventive concepts.
Figure 10:
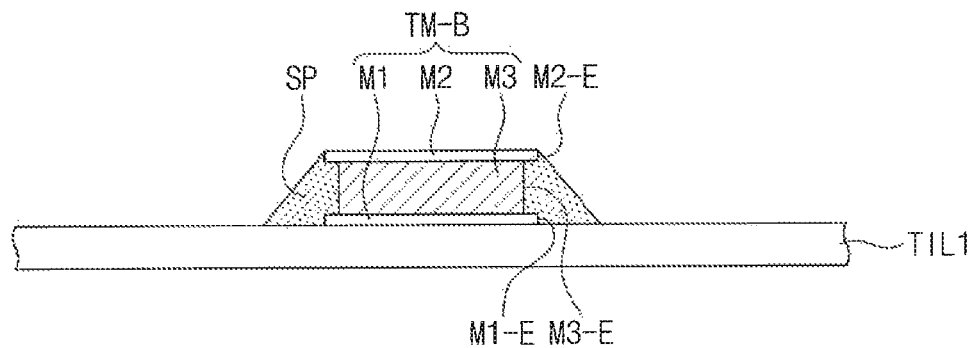
FIG. 10 is a cross-sectional view of an input detection unit according to an embodiment of the present inventive concepts.
Figure 11:
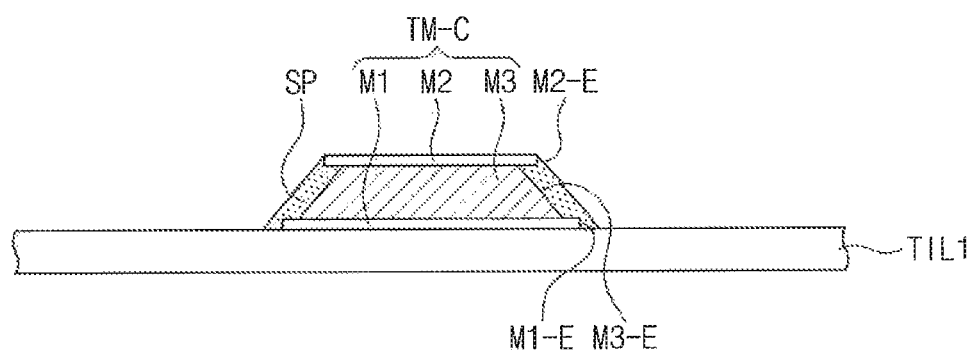
FIG. 11 is a cross-sectional view of an input detection unit according to an embodiment of the present inventive concepts.

FIG. 8 is a cross-sectional view of an input detection unit according to an embodiment of the present inventive concepts. FIG. 9 is a cross-sectional view of an input detection unit according to an embodiment of the present inventive concepts. FIG. 10 is a cross-sectional view of an input detection unit according to an embodiment of the present inventive concepts. FIG. 11 is a cross-sectional view of an input detection unit according to an embodiment of the present inventive concepts.

Referring to FIG. 8, the input detection unit TU-1 according to an embodiment of the present inventive concepts may include a compensation pattern SP-1. The compensation pattern SP-1 may be disposed on the first detection insulating layer TIL1 of the input detection unit TU. The compensation pattern SP-1 may surround the first conductive pattern TM1-1.

The second detection insulating layer TIL2 may cover the first detection insulating layer TIL1, the compensation pattern SP-1 and the first conductive pattern TM1-1. The second conductive pattern TM2 may be disposed on the second detection insulating layer TIL2. The third detection insulating layer TIL3 may cover the second detection insulating layer TIL2 and the second conductive pattern TM2.

The first conductive pattern TM1-1 may include a lower surface T-B, an upper surface T-U, and lateral side surfaces T-E. The lower surface T-B is directly disposed on the first detection insulating layer TIL1. The upper surface T-U is covered by the second detection insulating layer TIL2 and may face (e.g., be disposed opposite to) the lower surface T-B. The lateral side surfaces T-E extend from the lower surface T-B and the upper surface T-U and the lateral side surfaces T-E may connect the lower surface T-B to the upper surface T-U.

In the embodiment shown in FIG. 8, the lateral side surfaces T-E of the first conductive pattern TM1-1 may be inclined from the lower surface T-B toward the upper surface T-U. Accordingly, the shape of the first conductive pattern TM1-1 on a cross section may be substantially trapezoidal.

The compensation pattern SP-1 may cover the lateral side surfaces T-E of the first conductive pattern TM1-1. In an embodiment, the compensation pattern SP-1 may have a uniform thickness along the lateral side surfaces T-E. In an embodiment, the lateral side surfaces T-E of the first conductive pattern TM1-1 and the inclined surface of the compensation pattern SP-1 may both be inclined in a same angle in a range of about 45 degrees to about 70 degrees.

Referring to FIGS. 9 to 11, conductive patterns TM-A, TM-B, and TM-C according to embodiments of the present inventive concepts may be disposed in a plurality of layers. The conductive patterns TM-A, TM-B, and TM-C may include a lower pattern M1, an upper pattern M2, and an intermediate pattern M3.

The lower pattern M1 may be disposed directly on the first detection insulating layer TIL1. The upper pattern M2 may face (e.g., be disposed opposite to) the lower pattern M1. The intermediate pattern M3 may be disposed between the lower pattern M1 and the upper pattern M2 to cover the lower and upper surfaces of the intermediate pattern M3. In an embodiment, the lower pattern M1 and the upper pattern M2 may include titanium, and the intermediate pattern M3 may include aluminum. However, embodiments of the present inventive concepts are not limited thereto.

Referring to the embodiment of FIG. 9, the lateral side surfaces of each of the lower pattern M1, the upper pattern M2, and the intermediate pattern M3 may be aligned with each other in a direction of the thickness of the conductive pattern TM-A. The lateral side surfaces of each of the aligned lower pattern M1, upper pattern M2, and intermediate pattern M3 may be covered by the compensation pattern SP.

Referring to the embodiment of FIG. 10, the width of each of the lower pattern M1 and the upper pattern M2 in one direction (e.g., a horizontal direction parallel to an upper surface of the first detection insulating layer TIL1) may be greater than the width of the intermediate pattern M3 in the one direction. As shown in the embodiment of FIG. 10, the width of each of the lower pattern M1 and the upper pattern M2 in the one direction may be substantially equal to each other. Accordingly, a first lateral end and the opposite second lateral end of each of the lower pattern M1 and the upper pattern M2 may protrude from the lateral side surfaces of the intermediate pattern M3 on a cross section. The lateral side surface of each of the lower pattern M1, the upper pattern M2, and the intermediate pattern M3 may be covered by the compensation pattern SP.

Referring to FIG. 11, the widths of the lower pattern M1, the upper pattern M2, and the intermediate pattern M3 in one direction (e.g., a horizontal direction parallel to an upper surface of the first detection insulating layer TIL1) may be different from each other. For example, the width of the lower pattern M1 in the one direction may be greater than the widths of the upper pattern M2 and the intermediate pattern M3 in the one direction. The width of the upper pattern M2 may be larger than the width of the intermediate pattern M3 in the one direction. Accordingly, a first lateral end and the opposite second lateral end of each of the lower pattern M1 and the upper pattern M2 may protrude from the lateral side surfaces of the intermediate pattern M3 on a cross section. The first lateral end and the opposite second lateral end of the lower pattern M1 may protrude from the lateral ends of the upper pattern M2 and the intermediate pattern M3 on a cross section. The lateral side surfaces of each of the lower pattern M1, the upper pattern M2, and the intermediate pattern M3 may be covered by the compensation pattern SP.

Figure 12A:
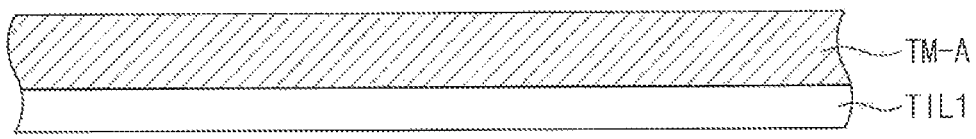
FIG. 12A is a cross-sectional view of a method of manufacturing an input detection unit according to an embodiment of the present inventive concepts.
Figure 12B:
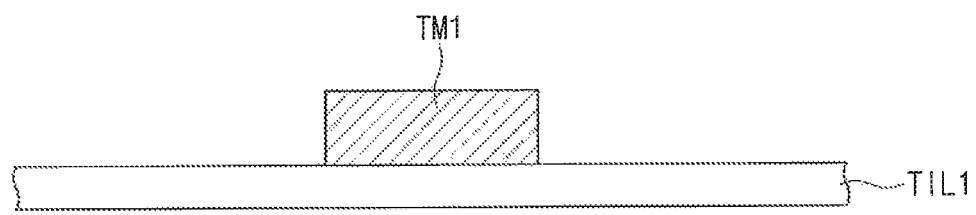
FIG. 12B is a cross-sectional view of a method of manufacturing an input detection unit according to an embodiment of the present inventive concepts.
Figure 12C:
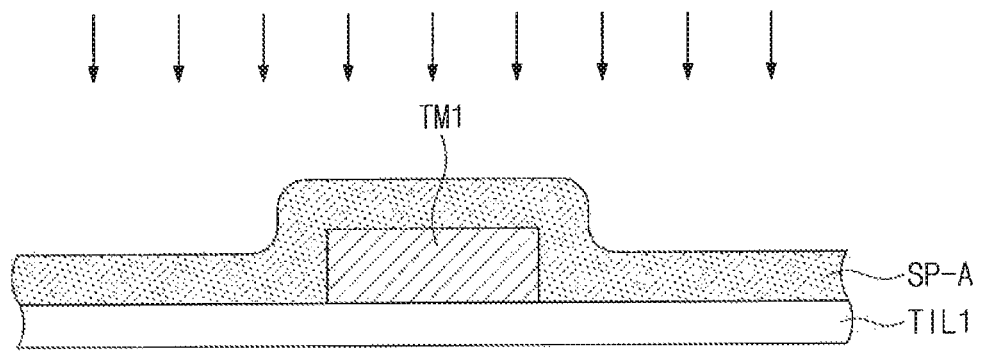
FIG. 12C is a cross-sectional view of a method of manufacturing an input detection unit according to an embodiment of the present inventive concepts.
Figure 12D:
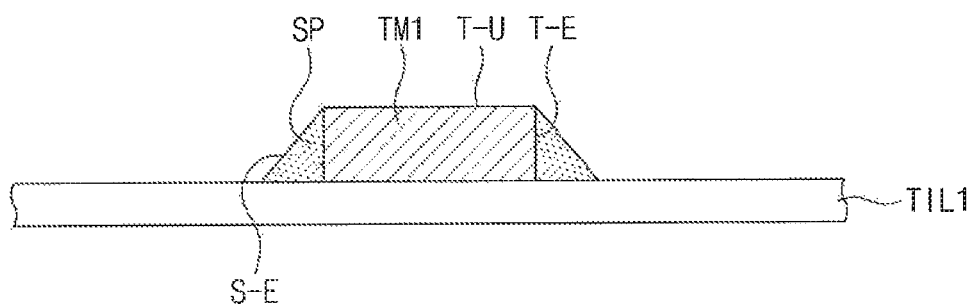
FIG. 12D is a cross-sectional view of a method of manufacturing an input detection unit according to an embodiment of the present inventive concepts.

FIG. 12A is a cross-sectional view of a method of manufacturing an input detection unit according to an embodiment of the inventive concept. FIG. 12B is a cross-sectional view of a method of manufacturing an input detection unit according to an embodiment of the present inventive concepts. FIG. 12C is a cross-sectional view of a method of manufacturing an input detection unit according to an embodiment of the present inventive concepts. FIG. 12D is a cross-sectional view of a method of manufacturing an input detection unit according to an embodiment of the present inventive concepts. The same/similar reference numerals are used for the same/similar components as in the embodiments of FIGS. 1 to 7, and repeated descriptions thereof are omitted for convenience of explanation.

Hereinafter, a method of manufacturing an input detection unit according to embodiments of the present inventive concepts will be described with reference to FIGS. 12A to 12D.

Referring to FIG. 12A, the method of manufacturing an input detection unit according to an embodiment of the present inventive concepts may include providing a conductive material TM-A formed on the first detection insulating layer TIL1. In an embodiment, the conductive material TM-A may include any one of a single-layered metal and a transparent conductive material. For example, the metal may include at least one compound selected from molybdenum, silver, titanium, copper, aluminum, and alloys thereof. The transparent conductive material may include a transparent conductive oxide such as at least one compound selected from indium tin oxide (ITO), indium zinc oxide (IZO), zinc oxide (ZnO), and indium tin zinc oxide (ITZO). In addition, the transparent conductive material may include a conductive polymer such as at least one material selected from PEDOT, metal nanowires, graphene, and the like.

Thereafter, referring to FIG. 12B, the method of manufacturing the input detection unit according to an embodiment of the present inventive concepts may include patterning the conductive material TM-A to form a conductive pattern TM1.

Thereafter, referring to FIG. 12C, the method of manufacturing the input detection unit according to an embodiment of the present inventive concepts may include applying a light blocking material SP-A on the first conductive pattern TM1. In an embodiment, the light blocking material SP-A may include any one of amorphous carbon and black photoresist. However, the material of the light blocking material SP-A is not limited thereto, and the material may be any material that absorbs light, does not have conductivity, and may be anisotropically etched.

Thereafter, referring to FIG. 12D, the method of manufacturing an input detection unit according to an embodiment of the present inventive concepts may include forming a compensation pattern SP by patterning the light blocking material SP-A. In an embodiment, the patterning of the light blocking material SP-A may be performed by a dry etch process. However, embodiments of the present inventive concepts are not limited thereto. The compensation pattern SP may cover the lateral side surfaces T-E of the first conductive pattern TM1 and expose the upper surface T-U.

According to an embodiment of the present inventive concepts, the compensation pattern SP, when additionally forming a conductive pattern on the first conductive pattern TM1, may prevent the conductive material from being thickly accumulated around the lateral side surfaces T-E of the first conductive pattern TM1 due to the step difference of the first conductive pattern TM1. Accordingly, in the process of patterning the conductive material, a desired additional conductive pattern is formed without particles. Accordingly, an input detection unit TU may have increased reliability and visibility.

According to an embodiment of the present inventive concepts, the compensation pattern surrounds the conductive pattern. Therefore, even if the thickness of the conductive pattern is increased, it is possible to prevent a problem that the lateral sides of the conductive pattern is reflected by external light and is visually recognized by the user.

In addition, it is possible to form a desired conductive pattern without particles on the detection insulating layer. Accordingly, an electronic device including an input detection unit with increased reliability and visibility may be provided.

Although embodiments of the present inventive concepts have been described, it is understood that the present inventive concepts should not be limited to these embodiments but various changes and modifications can be made by one ordinary skilled in the art within the spirit and scope of the present inventive concepts as hereinafter claimed.

What is claimed is:
1. An electronic device comprising:
a display panel including a plurality of pixels;
a first detection insulating layer disposed on the display panel;
a first conductive pattern disposed on the first detection insulating layer;
a compensation pattern disposed on the first detection insulating layer;
a second detection insulating layer disposed on the first detection insulating layer and covering the first detection insulating layer, the compensation pattern and the first conductive pattern; and
a second conductive pattern disposed on the second detection insulating layer,
wherein the first conductive pattern comprises:
a lower surface in contact with the first detection insulating layer;
an upper surface facing the lower surface and in contact with the second detection insulating layer; and
lateral side surfaces extending between the lower surface and the upper surface,
wherein the compensation pattern contacts the lateral side surfaces of the first conductive pattern.

2. The electronic device of claim 1, wherein the upper surface of the first conductive pattern is exposed by the compensation pattern.

3. The electronic device of claim 1, wherein the compensation pattern includes an inclined surface that is inclined in a direction from an upper surface of the first detection insulating layer towards the upper surface of the first conductive pattern.

4. The electronic device of claim 3, wherein the compensation pattern has a triangular shape in a cross section.

5. The electronic device of claim 3, wherein an inclined angle formed by the upper surface of the first detection insulating layer and the inclined surface is in a range of about 45 degrees to about 70 degrees.

6. The electronic device of claim 1, wherein the lateral side surfaces of the first conductive pattern are inclined in a direction from the lower surface of the first conductive pattern toward the upper surface of the first conductive pattern.

7. The electronic device of claim 1, wherein the first conductive pattern comprises:
a lower pattern disposed directly on the first detection insulating layer and including titanium (Ti);
an upper pattern covered by the second detection insulating layer and including Ti; and
an intermediate pattern disposed between the lower pattern and the upper pattern and including aluminum (Al).

8. The electronic device of claim 7, wherein in a first direction, widths of the lower pattern and the upper pattern are greater than a width of the intermediate pattern in the first direction.

9. The electronic device of claim 8, wherein a width of the lower pattern in the first direction is greater than a width of the upper pattern in the first direction.

10. The electronic device of claim 1, wherein the display panel comprises:
a circuit element layer including at least one transistor;
a display element layer including a light emitting element connected to the transistor; and
a sealing layer covering the display element layer,
wherein the first detection insulating layer is disposed directly on the sealing layer.

11. The electronic device of claim 1, wherein the compensation pattern comprises a light absorbing material.

12. An input detection unit comprising:
a first detection insulating layer;
a first conductive pattern disposed on the first detection insulating layer and including mesh lines;
a compensation pattern disposed on the first detection insulating layer;
a second detection insulating layer disposed on the first detection insulating layer and covering the first detection insulating layer, the compensation pattern and the first conductive pattern; and
a second conductive pattern disposed on the second detection insulating layer and including mesh lines,
wherein the first conductive pattern comprises:
a lower surface in contact with the first detection insulating layer;
an upper surface facing the lower surface and in contact with the second detection insulating layer; and
lateral side surfaces extending between the lower surface and the upper surface,
wherein the compensation pattern contacts the lateral side surfaces of the first conductive pattern.

13. The input detection unit of claim 12, wherein the upper surface of the first conductive pattern is exposed by the compensation pattern.

14. The input detection unit of claim 12, wherein the compensation pattern includes an inclined surface that is inclined in a direction from an upper surface of the first detection insulating layer towards the upper surface of the first conductive pattern.

15. The input detection unit of claim 14, wherein the compensation pattern has a triangular shape in a cross section.

16. The input detection unit of claim 14, wherein an inclined angle formed by the upper surface of the first detection insulating layer and the inclined surface is in a range of about 45 degrees to about 70 degrees.

17. The input detection unit of claim 12, wherein the lateral side surfaces of the first conductive pattern are inclined in a direction from the lower surface of the first conductive pattern toward the upper surface of the first conductive pattern.

18. The input detection unit of claim 12, wherein the first conductive pattern comprises:
a lower pattern disposed directly on the first detection insulating layer and including titanium (Ti);
an upper pattern covered by the second detection insulating layer and including Ti; and
an intermediate pattern disposed between the lower pattern and the upper pattern and including aluminum (Al).

19. The input detection unit of claim 12, wherein the input detection unit comprises:
a first detection electrode including first detection patterns arranged along a first direction and a first bridge pattern connected to the first detection patterns; and
a second detection electrode including second detection patterns arranged along a second direction intersecting the first direction and a second bridge pattern disposed between the second detection patterns,
wherein the first conductive pattern is composed of the first bridge pattern,
wherein the second conductive pattern is composed of the first detection patterns, the second detection patterns, and the second bridge pattern.

20. The input detection unit of claim 12, wherein the compensation pattern comprises a light absorbing material.

* * * * *